(12) United States Patent
Bjorklund et al.

(10) Patent No.: US 9,287,878 B2
(45) Date of Patent: Mar. 15, 2016

(54) SEMICONDUCTOR DEVICE

(71) Applicant: Semiconductor Energy Laboratory Co., Ltd., Atsugi-shi, Kanagawa-ken (JP)

(72) Inventors: Nora Bjorklund, Stockholm (SE); Takeshi Aoki, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/689,262

(22) Filed: Apr. 17, 2015

(65) Prior Publication Data
US 2015/0311897 A1 Oct. 29, 2015

(30) Foreign Application Priority Data

Apr. 25, 2014 (JP) ................................. 2014-091701
Sep. 5, 2014 (JP) ................................. 2014-180766

(51) Int. Cl.
*H03K 19/177* (2006.01)
*H03K 19/173* (2006.01)

(52) U.S. Cl.
CPC ........ *H03K 19/1776* (2013.01); *H03K 19/1733* (2013.01); *H03K 19/17736* (2013.01)

(58) Field of Classification Search
CPC .................. H03K 19/17736; H03K 19/17796; H03K 19/17728; H03K 19/177; H03K 19/1778; H03K 19/1735; H03K 19/17724; H03K 19/17748; H03K 19/1733; H03K 19/17704
See application file for complete search history.

(56) References Cited

U.S. PATENT DOCUMENTS 4,609,986 A 9/1986 Hartmann et al.
4,642,487 A 2/1987 Carter
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation Ultraviolet Lamp", Journal of Sol-Gel Science and Technology, 2003, vol. 26, pp. 181-184.
(Continued)

*Primary Examiner* — Jany Richardson
(74) *Attorney, Agent, or Firm* — Fish & Richardson P.C.

(57) ABSTRACT

A dynamic reconfigurable semiconductor device is provided. The semiconductor device includes two logic blocks, a pass transistor, two selection transistors and a precharge transistor. The two selection transistors are arranged to sandwich the pass transistor so that a source and a drain of the pass transistor are located between the sources of the two selection transistors. The sources and the drains of the two selection transistors are located between the two logic blocks. When the two selection transistors are in off-state, a potential can be supplied to the source or the drain of the pass transistor via the precharge transistor, and by electrical conduction, another potential for a context is applied to the gate of the pass transistor. When the context is executed, the gate of the pass transistor is in a floating state, the two selection transistors are in on-state, and the precharge transistor is in off-state.

20 Claims, 23 Drawing Sheets

(56) References Cited

U.S. PATENT DOCUMENTS

| | | |
|---|---|---|
| 4,870,302 A | 9/1989 | Freeman |
| 5,343,406 A | 8/1994 | Freeman et al. |
| 5,352,940 A | 10/1994 | Watson |
| 5,432,719 A | 7/1995 | Freeman et al. |
| 5,488,316 A | 1/1996 | Freeman et al. |
| 5,731,856 A | 3/1998 | Kim et al. |
| 5,744,864 A | 4/1998 | Cillessen et al. |
| 5,808,942 A | 9/1998 | Sharpe-Geisler |
| 6,057,704 A | 5/2000 | New et al. |
| 6,127,702 A | 10/2000 | Yamazaki et al. |
| 6,172,521 B1 | 1/2001 | Motomura |
| 6,294,274 B1 | 9/2001 | Kawazoe et al. |
| 6,535,422 B2 | 3/2003 | Goto et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,084,665 B1 | 8/2006 | Lewis et al. |
| 7,098,689 B1 | 8/2006 | Tuan et al. |
| 7,105,868 B2 | 9/2006 | Nause et al. |
| 7,196,942 B2 | 3/2007 | Khurana et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,797,664 B2 | 9/2010 | Matsumoto et al. |
| 8,072,237 B1 | 12/2011 | Rahim et al. |
| 8,248,101 B2 | 8/2012 | Voogel et al. |
| 8,547,753 B2 | 10/2013 | Takemura et al. |
| 8,675,382 B2 | 3/2014 | Kurokawa |
| 9,007,093 B2 | 4/2015 | Kurokawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0300201 A1 | 12/2007 | Matsumoto et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0243652 A1 | 10/2009 | Dorairaj et al. |
| 2009/0278122 A1 | 11/2009 | Hosono et al. |
| 2009/0280600 A1 | 11/2009 | Hosono et al. |
| 2010/0039138 A1 | 2/2010 | Bertin |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0101351 A1 | 5/2011 | Yamazaki |
| 2011/0175646 A1 | 7/2011 | Takemura et al. |
| 2012/0212995 A1 | 8/2012 | Kurokawa |
| 2012/0293200 A1* | 11/2012 | Takemura .......... H03K 19/1736 326/38 |
| 2012/0293201 A1 | 11/2012 | Fujita et al. |
| 2012/0293202 A1 | 11/2012 | Nishijima et al. |
| 2012/0293206 A1 | 11/2012 | Yoneda et al. |
| 2012/0293209 A1 | 11/2012 | Takewaki |
| 2012/0293242 A1 | 11/2012 | Kato |
| 2013/0207170 A1 | 8/2013 | Kurokawa |
| 2013/0285697 A1 | 10/2013 | Kurokawa |
| 2013/0285698 A1 | 10/2013 | Fukutome |
| 2013/0286757 A1* | 10/2013 | Takemura ............... G11C 29/04 365/200 |
| 2013/0293262 A1 | 11/2013 | Takemura |
| 2013/0293263 A1* | 11/2013 | Kurokawa ............ H03K 19/094 326/41 |
| 2013/0314124 A1 | 11/2013 | Ikeda et al. |
| 2013/0321025 A1 | 12/2013 | Kurokawa et al. |
| 2014/0103960 A1* | 4/2014 | Yamazaki .......... H03K 19/0013 326/41 |
| 2014/0159771 A1 | 6/2014 | Ikeda et al. |
| 2014/0225644 A1* | 8/2014 | Aoki ................. H03K 19/1776 326/41 |
| 2015/0008958 A1* | 1/2015 | Kurokawa ...... H03K 19/018521 326/41 |
| 2015/0192641 A1* | 7/2015 | Kurokawa ...... G01R 31/318371 324/762.01 |
| 2015/0226802 A1* | 8/2015 | Kurokawa ........ G01R 31/31919 324/762.01 |

(56) References Cited

U.S. PATENT DOCUMENTS

2015/0263735 A1* 9/2015 Kurokawa .......... H03K 19/1776
326/38

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technincal Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applies Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-2456202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passication Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistros by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Conrtolled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Naito.T et al., "World's first monolithic 3D-FPGA with TFT SRAM over 90nm 9 layer Cu CMOS", 2010 Symposium on VLSI Technology : Digest of Technical Papers, Jun. 15, 2010, pp. 219-220.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

(56) References Cited

OTHER PUBLICATIONS

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Song.I et al., "Short Channel Characteristics of Gallium—Indium—Zinc—Oxide Thin Film Transistors for Three-Dimensional Stacking Memory", IEEE Electron Device Letters, Jun. 1, 2008, vol. 29, No. 6, pp. 549-552.

Matsuzaki.T et al., "1Mb Non-Volatile Random Access Memory Using Oxide Semiconductor", IMW 2011 (3rd IEEE International Memory Workshop), May 22, 2011, pp. 185-188.

Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 46, No. 6, pp. 1495-1505.

Eslami.F et al., "Capacitive Boosting for FPGA Interconnection Networks", 21st International Conference on Field Programmable Logic and Applications, 2011, vol. 21, pp. 453-458.

Kozuma.M et al., "Crystalline In—Ga—Zn—O FET-based Configuration Memory for Multi-Context Field-Programmable Gate Array Realizing Fine-Grained Power Gating", SSDM 2013 (Extended Abstracts of the 2013 International Conference on Solid State Devices and Materials), Sep. 24, 2013, pp. 1096-1097.

Okamoto.Y et al., "Novel Application of Crystalline Indium—Gallium—Zinc—Oxide Technology to LSI:Dynamically Reconfigurable Programmable Logic Device Based on Multi-Context Architecture", ECS Transactions, Jul. 7, 2013, vol. 54, No. 1, pp. 141-149, The Electrochemical Society.

\* cited by examiner

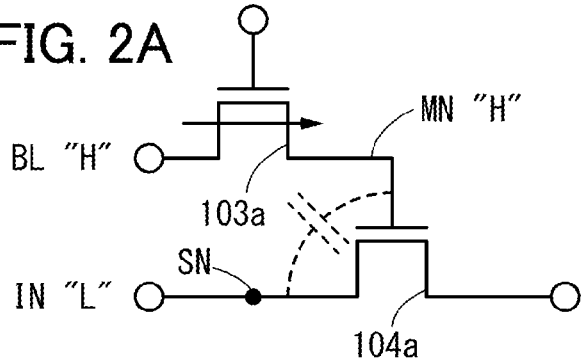
FIG. 2A  During Reconfiguration
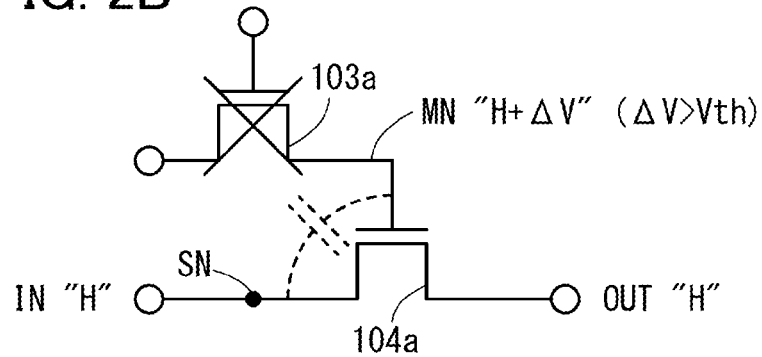
FIG. 2B  In Use
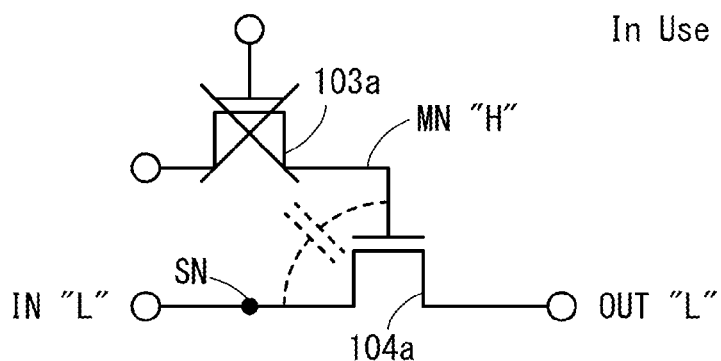
FIG. 2C  In Use FIG. 3A    During Reconfiguration
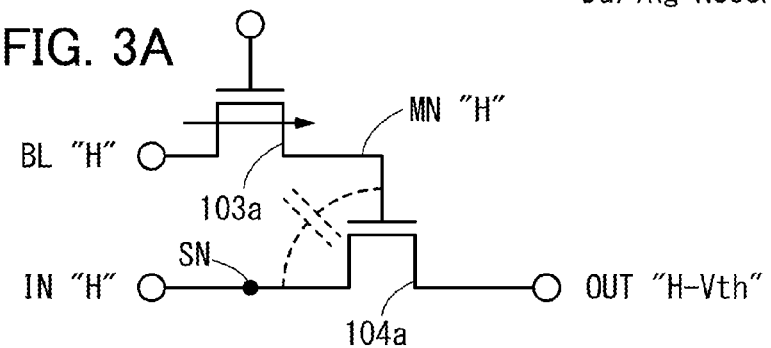
FIG. 3B    In Use
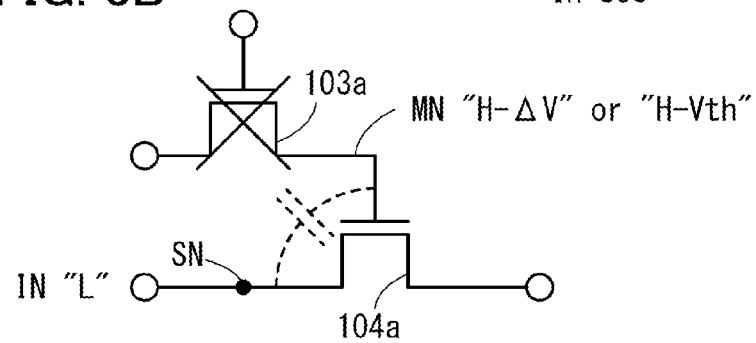
FIG. 3C    In Use
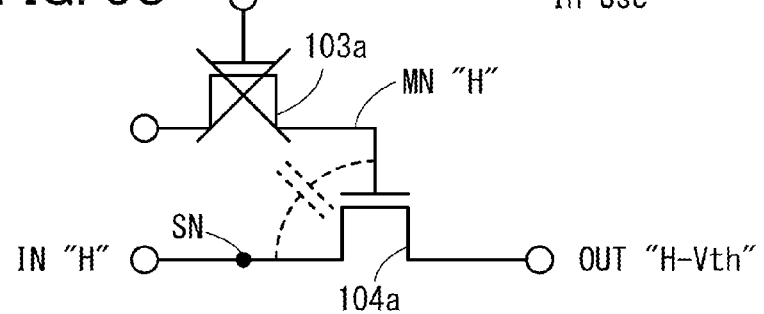

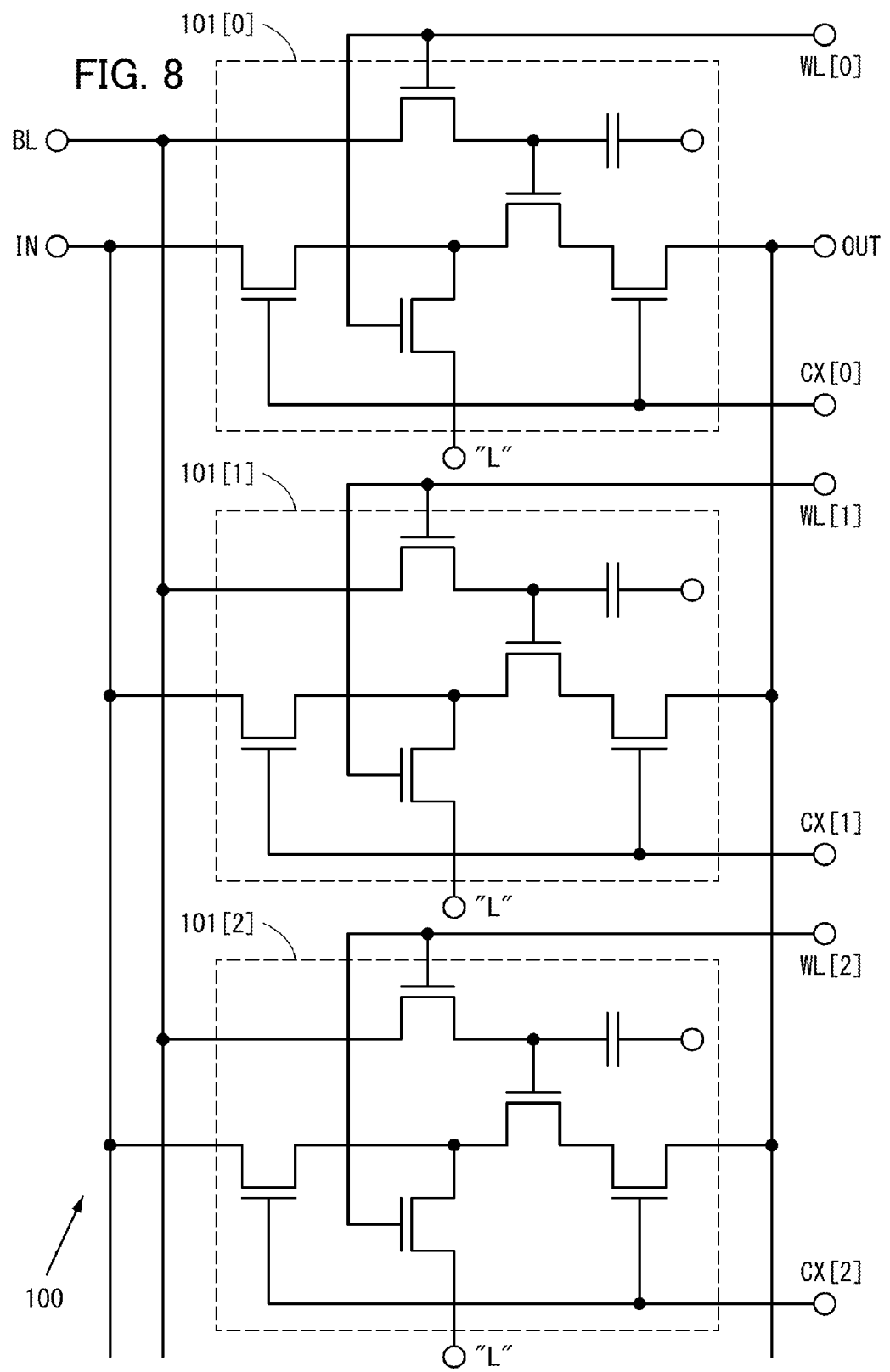

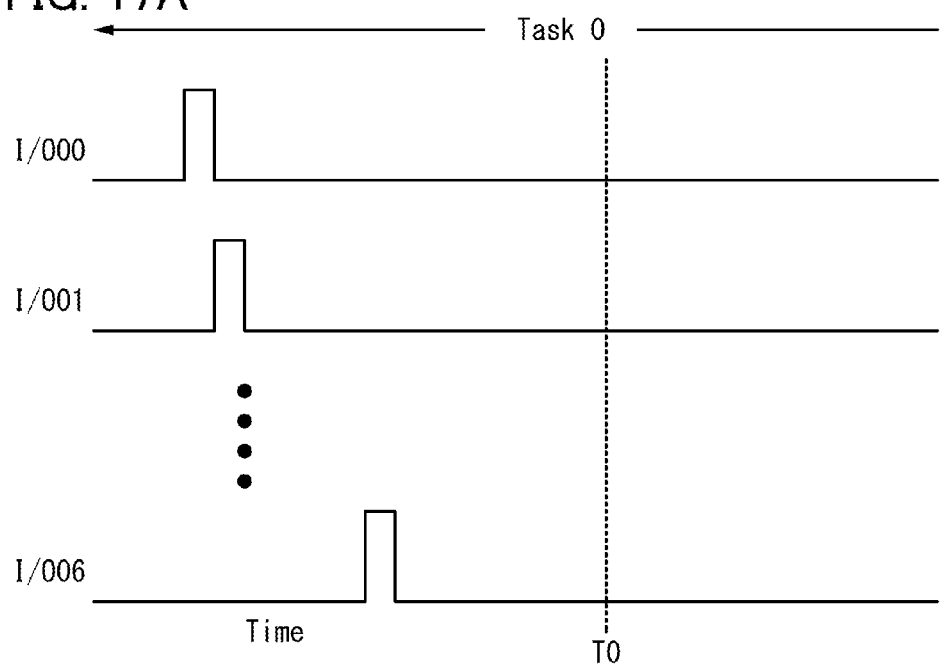
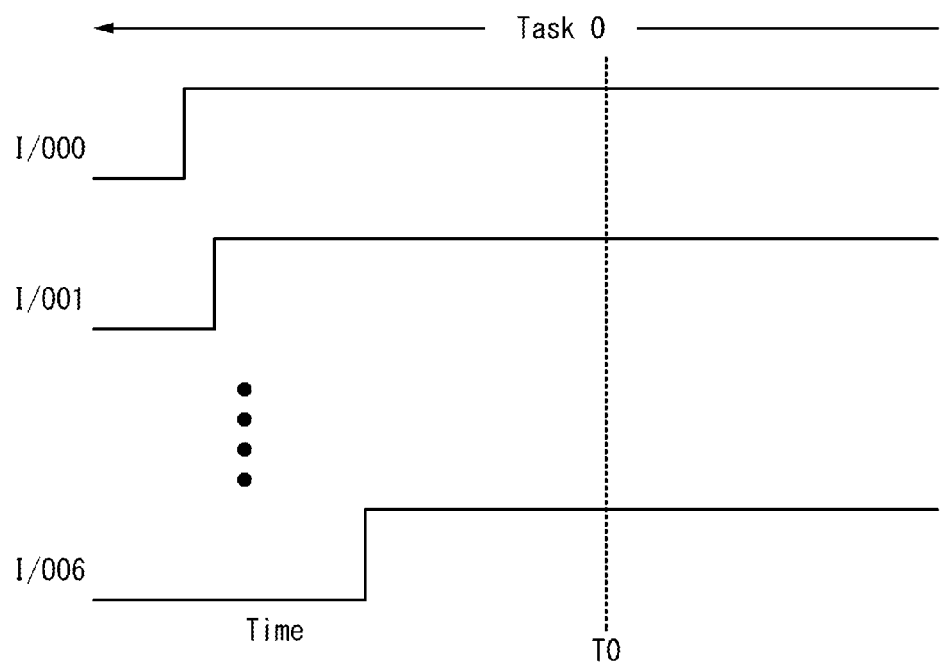

SEMICONDUCTOR DEVICE

BACKGROUND OF THE INVENTION

1. Field of the Invention

This disclosure is related to semiconductor devices.

2. Description of the Related Art

A routing switch in a field programmable gate array (FPGA) acts as a switch that decides a connection between two logic blocks (LB), or between an LB and an input/output (I/O) circuit. The routing switch holds information of the connection in a configuration memory that connects to a pass gate (a pass transistor).

Recently, FPGAs using oxide semiconductors as channel layers of transistors are proposed (Patent Documents 1 and 2). The oxide-semiconductor-based FPGAs have advantages in reducing power consumption and downsizing. Further, a multi-context FPGA that have more than one configuration are proposed (Non Patent Document 1).

REFERENCE

Patent Document

[Patent Document 1] U.S. Pat. No. 8,547,753
[Patent Document 2] U.S. Pat. No. 8,675,382

Non Patent Document

[Non Patent Document 1] Y. Okamoto et al. "Novel application of crystalline indium-gallium-zinc-oxide technology to LSI: Dynamically reconfigurable programmable logic device based on multi-context architecture.", In 2013 International Conference on Semiconductor Technology for Ultra Large Scale Integrated Circuits and Thin Film Transistors (ULSIC vs. TFT 4).

SUMMARY OF THE INVENTION

Any of new circuits, architectures, driving methods, devices related to semiconductor devices is provided in this disclosure.

For example, a semiconductor device including a first logic block, a second logic block and a programmable switch is presented. The first logic block and the second logic block are connectable through the programmable switch. The programmable switch includes a pass transistor, a first transistor, a second transistor and a third transistor. The first transistor, the pass transistor and the second transistor are connected in series in this order. Sources and drains of both the first transistor and the second transistor are located between the first logic block and the second logic block in a circuit diagram. The semiconductor device is designed so that a potential can be supplied to one of a source and a drain of the pass transistor via the third transistor when both of the first transistor and the second transistor are in off-state.

For example, a semiconductor device including two logic blocks, a pass transistor, two selection transistors and a precharge transistor is presented. The two selection transistors are arranged to sandwich the pass transistor so that the pass transistor is located between the sources of the two selection transistors. The sources and the drains of the two selection transistors are located between the two logic blocks. A potential can be supplied to a source or a drain of the pass transistor via the precharge transistor in on-state, and by electrical conduction, another potential for a context is applied to a gate of the pass transistor when the two selection transistors are in off-state. The gate of the pass transistor is substantially electrically isolated (floating), the two selection transistors are in on-state and the precharge transistor is in off-state when the context is executed.

The foregoing semiconductor device is novel and has advantage for one or more of the following points: reducing the power consumption, enhancing the processing speed, and obtaining any of the stability, reliability, or those described below.

BRIEF DESCRIPTION OF THE DRAWINGS

In the accompanying drawings:

FIGS. 2A to 2C show examples for explaining operations of a pass transistor;
FIGS. 3A to 3C show examples for explaining operations of a pass transistor;
FIG. 8 shows an example of a routing switch;
FIGS. 17A and 17B show schematic diagrams of potentials of input/output circuits in Example.

DETAILED DESCRIPTION OF THE INVENTION

Embodiments will hereinafter be described with reference to drawings. However, the embodiments can be implemented with many different modes. It will be readily appreciated by those skilled in the art that modes and details can be changed in various ways without departing from the spirit and scope.

Embodiment 1

Figure 1A:
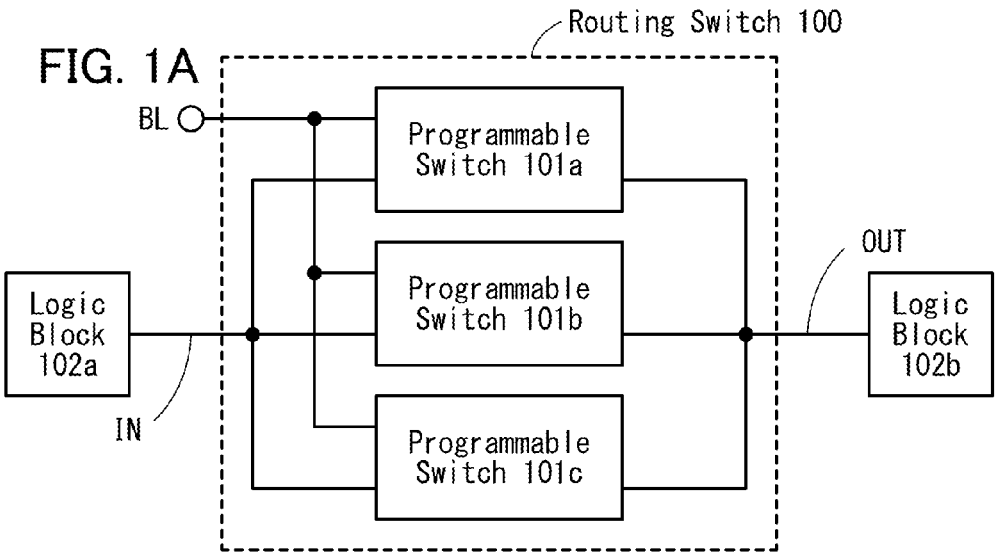
FIGS. 1A and 1B show examples for explaining a multi-context FPGA.

FIG. 1A is a block diagram of a part of a multi-context FPGA. The multi-context FPGA has a routing switch 100, a logic block 102a and a logic block 102b. The logic block 102a and the logic block 102b can be connected via the routing switch 100.

For example, an output signal of the logic block 102a can be input to the logic block 102b when the routing switch 100 is in on-state. In contrast, the logic block 102a and the logic block 102b are electrically isolated when the routing switch 100 is in off-state. Here, a node between the routing switch 100 and the logic block 102a is called "IN" and a node between the routing switch 100 and the logic block 102b is called "OUT".

The routing switch 100 has two or more programmable switches. For example, the routing switch 100 has a programmable switch 101a, a programmable switch 101b and a programmable switch 101c, each has configuration data independently. The configuration data are supplied by a bit line BL to each programmable switch. Note that other wirings may be added for writing configuration data, selecting the programmable switches, and so on.

Figure 1B:
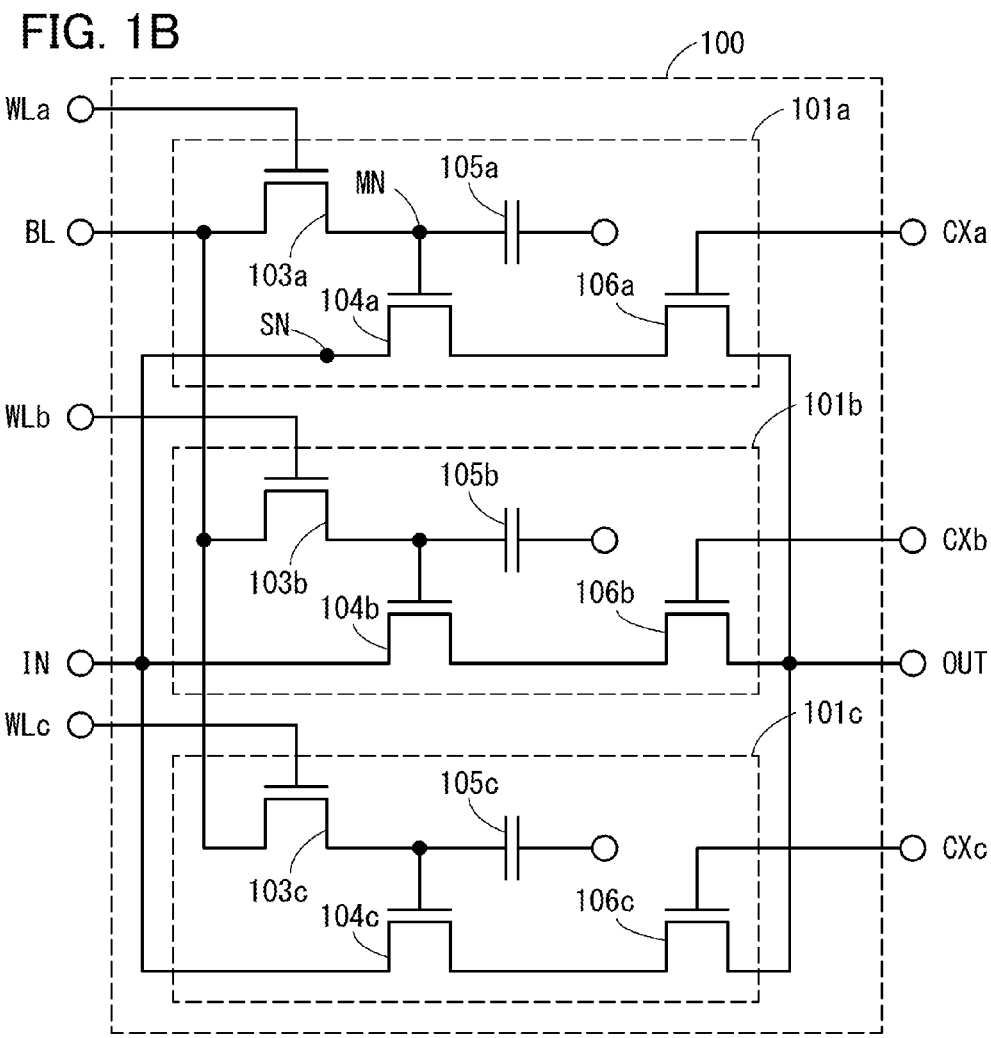

FIG. 1B shows an example of a routing switch 100 comprising the programmable switches. For example, the programmable switch 101a comprises a write transistor 103a, a pass transistor 104a, a capacitor 105a and a selection transistor 106a.

In this embodiment, the write transistor 103a, the pass transistor 104a, and the selection transistor 106a are n-type. However, some or all of them may be p-type.

One electrode of the capacitor 105a may be connected with a gate of the pass transistor 104a. The source and the drain of the write transistor 103a may be provided between the one electrode of the capacitor 105a and the bit line BL.

Further, the write transistor 103a, the pass transistor 104a, and the selection transistor 106a may be other switching elements such as transmission gates. Using the transmission gates may be advantageous in speed, reducing power consumption and/or lowering driving voltage since a signal potential would not be lowered.

Similarly, the programmable switch 101b includes a write transistor 103b, a pass transistor 104b, a capacitor 105b and a selection transistor 106b, and the programmable switch 101c includes a write transistor 103c, a pass transistor 104c, a capacitor 105c and a selection transistor 106c.

The write transistor 103a, the write transistor 103b and the write transistor 103c are configured to be controlled by a word line WLa, a word line WLb and a word line WLc, respectively. Writing the configuration data to the programmable switch 101a is conducted when the write transistor 103a is in on-state. The potential of the gate of the pass transistor 104a (memory node MN) will correspond to the configuration data (or the potential of the bit line BL) when the write transistor 103a is in on-state.

It should be noted that the memory node MN is substantially and electrically connectable to other wirings only via the write transistor 103a. Therefore, the memory node MN is electrically isolated when the write transistor 103a is in off-state. Of course, two or more transistors may be connected to the memory node MN with their source electrodes or drain electrodes. In this case, the memory node MN is electrically isolated when all the transistors are in off-state.

In one example, the source-drain current of the write transistor 103a in off-state is less than 1 zA ($1\times10^{-21}$ A) for storing charges at the memory node MN for a sufficient period. The period for the memory node MN to store the sufficient charges depends on the source-drain current in off-state (the off-state current) and on the capacitance at the memory node MN. A leakage current from the memory node MN via other paths (between the gate and the memory node MN (so-called gate leakage), for example) may be less than 1 zA.

As described in the Patent Documents 1 and 2, and the Non Patent Document 1, oxide-semiconductor-based transistors can be ideal for this purpose, and the memory node MN substantially serves as a part of a non-volatile memory.

Since the oxide-semiconductor-based transistor has a thin oxide semiconductor film as its active layer, two gate electrodes may be provided so as to face each other with the oxide semiconductor film therebetween.

In one example, the oxide-semiconductor-based transistor comprises one gate electrode facing one surface of the oxide semiconductor film. In another example, the oxide-semiconductor-based transistor comprises another gate electrode facing another surface of the oxide semiconductor film in addition to the one gate electrode.

The state (ON or OFF) of the pass transistor 104a mainly depends on the potential of the memory node MN. For example, the transistor 104a is in on-state if the potential difference between the memory node MN and the pass transistor 104a is larger than the threshold voltage of the pass transistor 104a.

The selection transistor 106a is configured to be controlled by a context line CXa through which a context signal (a signal for selecting one context) is transmitted. It is necessary that both of the selection transistor 106a and the pass transistor 104a are in on-state in order that the node IN and the node OUT may be connected (or in order that signals may pass from the node IN to the node OUT through the selection transistor 106a and the pass transistor 104a). Similarly, the selection transistor 106b and the selection transistor 106c are configured to be controlled by a context line CXb and a context line CXc, respectively.

As shown in FIG. 1B, since the selection transistor 106a, the selection transistor 106b and the selection transistor 106c can be independently controlled, by selecting one of them, a context that are stored in the selected programmable switch becomes executable. For example, by selecting the selection transistor 106b, the context stored in the programmable switch 101b becomes executable.

In the above example, three contexts are executable at most because the routing switch 100 has the three programmable switches. But more contexts are executable by adding more programmable switches. Alternatively, the routing switch 100 may have only two programmable switches or less.

Since the write transistor 103a, the write transistor 103b and the write transistor 103c can be controlled independently, the configuration data can be written to the programmable switch 101a, the programmable switch 101b and the programmable switch 101c, independently.

Moreover, it is possible to write the configuration data to the programmable switch 101a (not in use) even when the programmable switch 101b is in use. This operation is called "dynamic reconfiguration". For example, while a first task based on a first context stored in the programmable switch 101b is executed, new configuration data can be written to the programmable switch 101a.

The potential of the source electrode (or the drain electrode) of the pass transistor 104a plays an important role when writing the configuration data. The reasons are explained with reference to FIGS. 2A to 2C and FIGS. 3A to 3C.

FIG. 2A shows that configuration data "H" (a high level potential, 0.8V, for example) is written to the programmable switch. Here, the potential of the bit line BL is "H", and accordingly, the potential of the memory node MN will be (substantially) "H". Meanwhile, the potential of the node IN is set to be "L" (a low level potential, 0V, for example), which is lower than the potential of the bit line BL by more than the threshold voltage of the pass transistor 104a. Therefore, the pass transistor 104a is in on-state and the memory node MN is capacitively coupled with the node IN (and the source node SN) via a channel of the pass transistor 104a.

After the write transistor 103a is turned off, if the potential of the node IN is raised from "L" to "H", the potential of the memory node MN is enhanced to "H+ΔV" by the capacitive coupling (FIG. 2B). This is called "boosting effect". If ΔV is larger than Vth (the threshold voltage of the pass transistor 104a), the potential of the node OUT can be heightened from "L" to "H". If ΔV is smaller than Vth, the potential of the node OUT may not reach "H". However, since on-resistance of the pass transistor 104a is lowered, the signal delay by the pass transistor 104a can be reduced.

If the potential of the node IN is lowered to "L", the potential of the memory node MN returns to "H" by the capacitive coupling (FIG. 2C).

FIG. 3A also shows a condition where the configuration data "H" is written to the programmable switch, but here the potential of the node IN is set to "H". Here, it is supposed that the potential of the node OUT is "H−Vth" but the pass transistor 104a remains in on-state. Then, the memory node MN is capacitively coupled with the node IN (and the source node SN) via the channel of the pass transistor 104a.

After the write transistor 103a is turned off, if the potential of the node IN is lowered from "H" to "L", the potential of the memory node MN is depressed to either "H−ΔV" or "H−Vth", whichever has a higher potential than the other, by the capacitive coupling (FIG. 3B). This is called "reverse boosting effect". If the initial potential of the node OUT has been "H−Vth" as mentioned above, it takes longer time for lowering the potential to "L" because of higher on-resistance of the pass transistor 104a due to the lower potential of its gate.

If the potential of the node IN is heightened to "H", the potential of the memory node MN returns to "H" by the capacitive coupling, but the potential of the node OUT cannot surpass "H−Vth" (FIG. 3C).

As shown in FIGS. 3B and 3C, it may be problematic to set the potential of the source node SN to "H" when writing the configuration data. As a conclusion, it is preferable that the potential of the source node SN be lower than the possible highest potential of the memory node MN by more than Vth when writing the configuration data. For example, the potential of the node IN is set to "L" when writing the configuration data.

In the circuit shown in FIG. 1B, the potential of the source node SN may be "H" or "L", depending on an output of the logic block 102a. Therefore, performance of the programmable switch 101a depends on the output of the logic block 102a and configuration timing. That is, the programmable switch 101a may show excellent performance due to the boosting effect as shown in FIGS. 2A to 2C if the output of the logic block 102a is "L" when writing the configuration data, or otherwise, it may show poor performance due to the reverse boosting effect as shown in FIGS. 3A to 3C. In this way, the programmable switch (and the FPGA) could be unstable or does not operate properly.

Furthermore, since a circuit is operated based on the most delayed signal, if the signal is hastened or delayed in accordance with circumstances, a clock, for example, is set based on the delayed case. Therefore, if both of the cases, the hastened case as shown in FIGS. 2A to 2C and the delayed case as shown in FIGS. 3A to 3C, occur, the clock may be set considering the case of FIGS. 3A to 3C. As the result, the circuit operation may be slowed down.

In the programmable switch in FIG. 1B, the source node SN is not protected and its potential is substantially the same as that of the node IN. Therefore, the reverse boosting effect is inevitable. A circuit shown in FIG. 4A overcomes such difficulties.

Figure 4A:
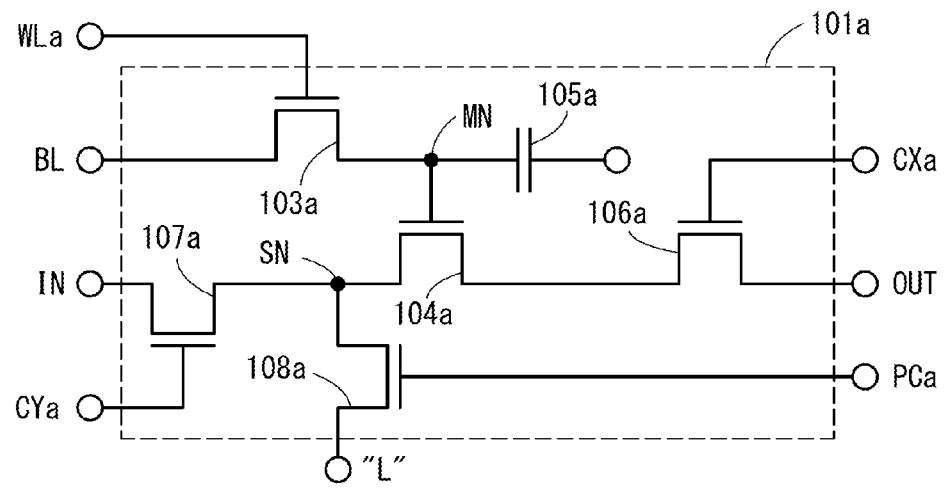
FIGS. 4A and 4B show examples of a programmable switch.

The programmable switch 101a shown in FIG. 4A comprises the write transistor 103a, the pass transistor 104a, the capacitor 105a and the selection transistor 106a, similar to the programmable switch shown in FIG. 1B. In addition, the programmable switch 101a shown in FIG. 4A comprises a selection transistor 107a and a precharge transistor 108a.

The selection transistor 107a, the pass transistor 104a and the selection transistor 106a are connected in series in this order between the node IN and the node OUT. The selection transistor 106a and the selection transistor 107a are controlled by the context line CXa and the context line CYa, respectively. By turning off the selection transistor 106a and the selection transistor 107a, a source and a drain of the pass transistor 104a can be electrically isolated from the node IN and the node OUT.

One of a source and a drain of the precharge transistor 108a is connected with one of the source and the drain of the pass transistor 104a. A potential is supplied to the other of the source and the drain of the precharge transistor 108a in this example. The potential may be "L", for example, but any potential lower than the possible highest potential of the memory node MN at least by Vth (the potential lower than "H−Vth", for example) is available. In one example, the potential is not lower than "L−Vth".

It should be noted that the potential of the other of the source and the drain of the precharge transistor 108a may be "H" or another potential as long as the precharge transistor 108a is in off-state. Accordingly, the potential of the other of the source and the drain of the precharge transistor 108a may be constant or variable. For that potential, the potential of another electrode of the capacitor 105a may be used, for example.

The precharge transistor 108a is controlled by a precharge line PCa. The potential of the source node SN can be set to "L", for example, by turning off the selection transistor 106a and the selection transistor 107a and turning on the precharge transistor 108a.

As described above, in the dynamic reconfiguration, writing configuration data to a programmable switch is executed while a context stored in the programmable switch is not executed. Therefore, the selection transistor 106a and the selection transistor 107a can be in off-state when writing the configuration data to the programmable switch.

In an example, the precharge transistor 108a can be in on-state in whole or a part of the period that both of the selection transistor 106a and the selection transistor 107a are in off-state. In an example, the precharge transistor 108a may be in on-state when or before the write transistor 103a is turned off.

The selection transistor 106a and the selection transistor 107a can be turned on or off in synchronization with each other. In the programmable switch 101a shown in FIG. 4B, both of the selection transistor 106a and the selection transistor 107a are controlled by a single context line CXa.

Figure 5A:
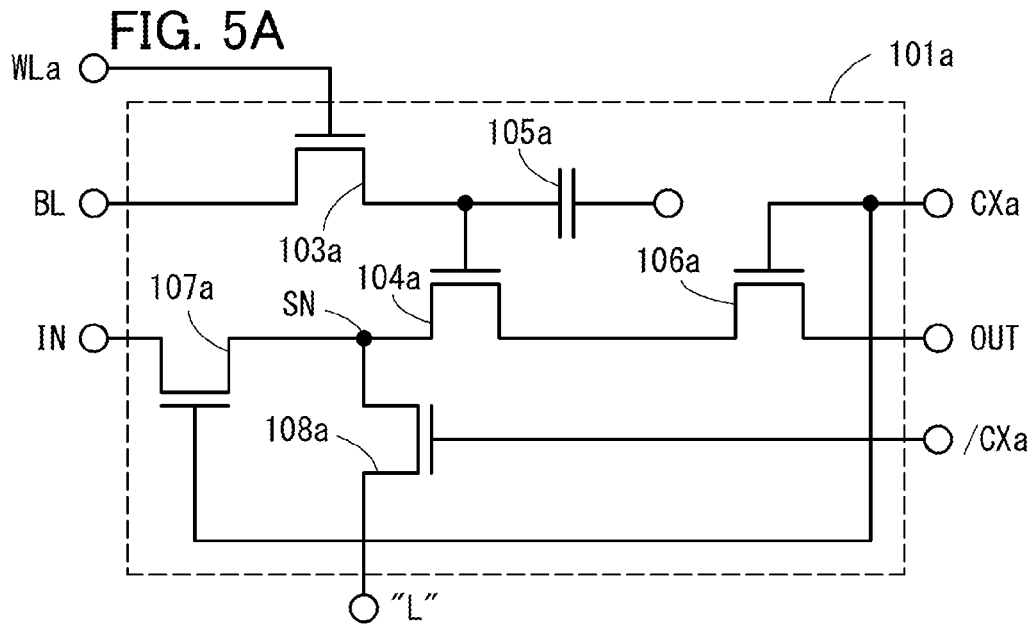
FIGS. 5A and 5B show examples of a programmable switch.

As described above, the precharge transistor 108a may be in on-state when both of the selection transistor 106a and the selection transistor 107a are in off-state. Therefore, the precharge transistor 108a can be turned on or off inversely with the selection transistor 106a and the selection transistor 107a. In the programmable switch 101a shown in FIG. 5A, the precharge transistor 108a is controlled by an inverse-context line /CXa transmitting an inverse-context signal (an inversion signal of a context signal).

Figure 5B:
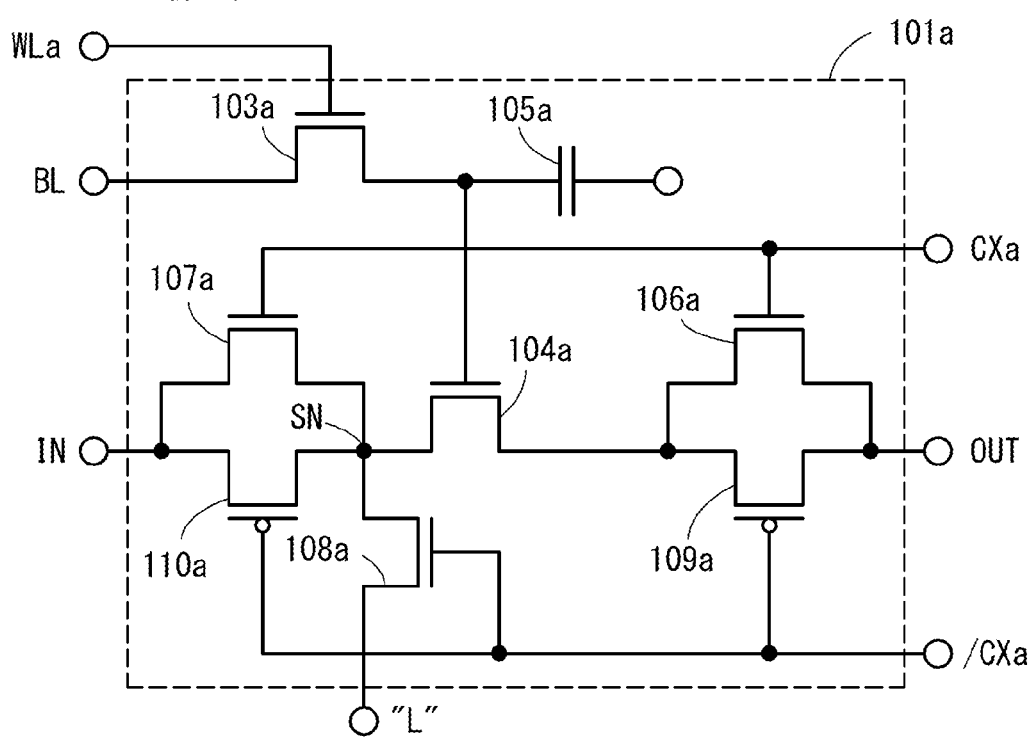

If the programmable switch 101a comprises transmission gates as shown in FIG. 5B, the inverse-context line /CXa and the inverse-context signals can be used for controlling p-type transistors (a selection transistor 109a and a selection transistor 110a).

Figure 6A:
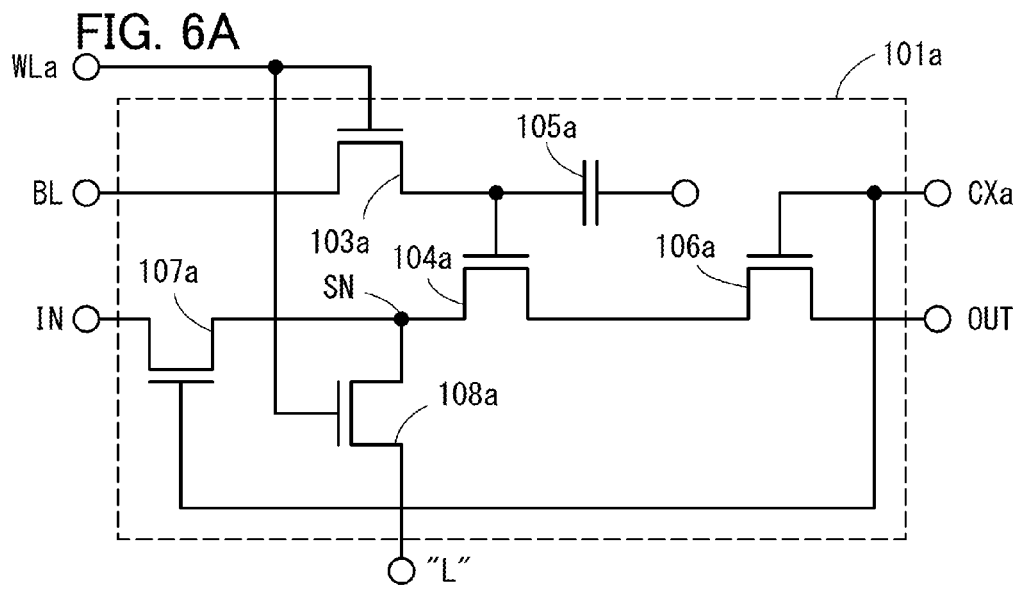
FIGS. 6A and 6B show examples of a programmable switch.

FIG. 6A shows another example of the programmable switch 101a. In this example, the precharge transistor 108a is also controlled by the word line WLa as well as the write transistor 103a. That is, the precharge transistor 108a can be turned on or off, synchronized with the write transistor 103a.

Figure 6B:
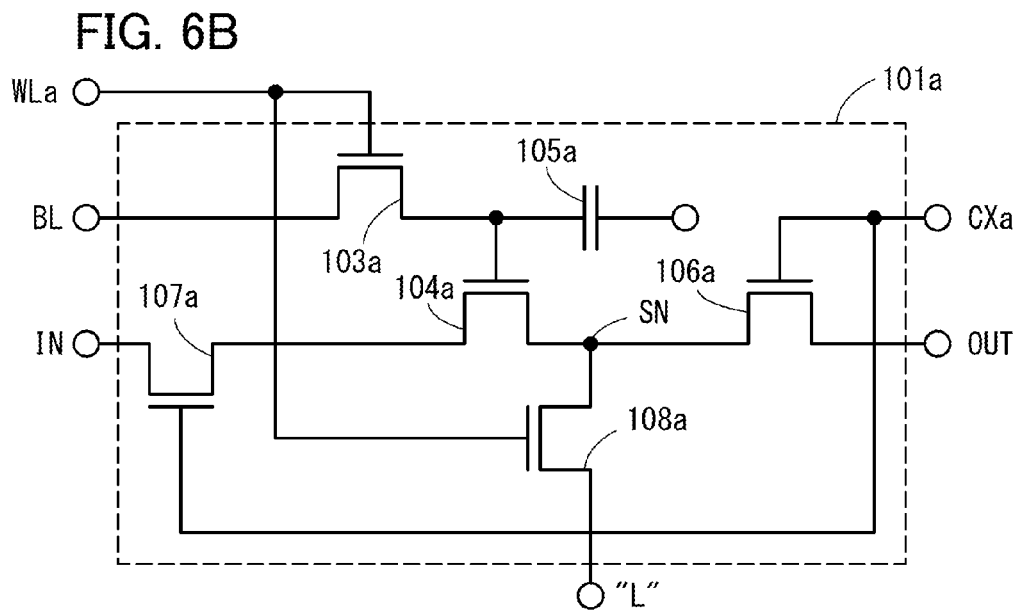

FIG. 6B shows another example of the programmable switch 101a. In this example, the programmable switch 101a of FIG. 6A is modified so that the source node SN is provided between the pass transistor 104a and the selection transistor 106a. Such modification can be applied also to the programmable switches shown in FIGS. 4A and 4B and FIGS. 5A and 5B.

Figure 7A:
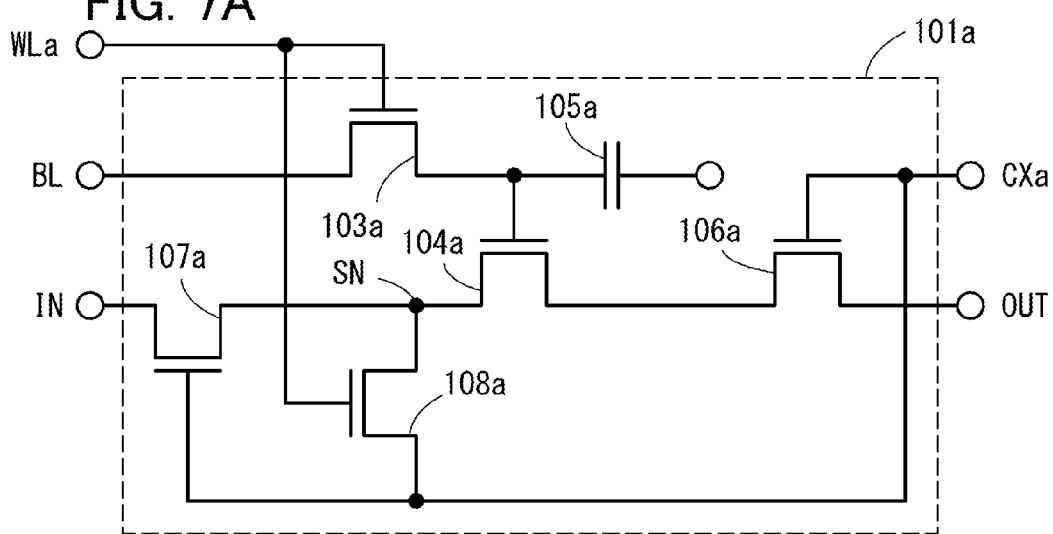
FIGS. 7A and 7B show examples of a programmable switch.

FIG. 7A shows another example of the programmable switch 101a. In this example, the programmable switch 101a of FIG. 6A is modified so that the precharge transistor 108a is provided between the source node SN and the context line CXa.

When the potential of the context line CXa is raised in order to turn on the selection transistor 106a and the selection transistor 107a, the precharge transistor 108a is in off-state as well as the write transistor 103a. If the precharge transistor 108a and the write transistor 103a are turned on while the potential of the context line CXa is lowered in order to turn off the selection transistor 106a and the selection transistor 107a, the source node SN can be precharged with the lowered potential ("L", for example).

Figure 7B:
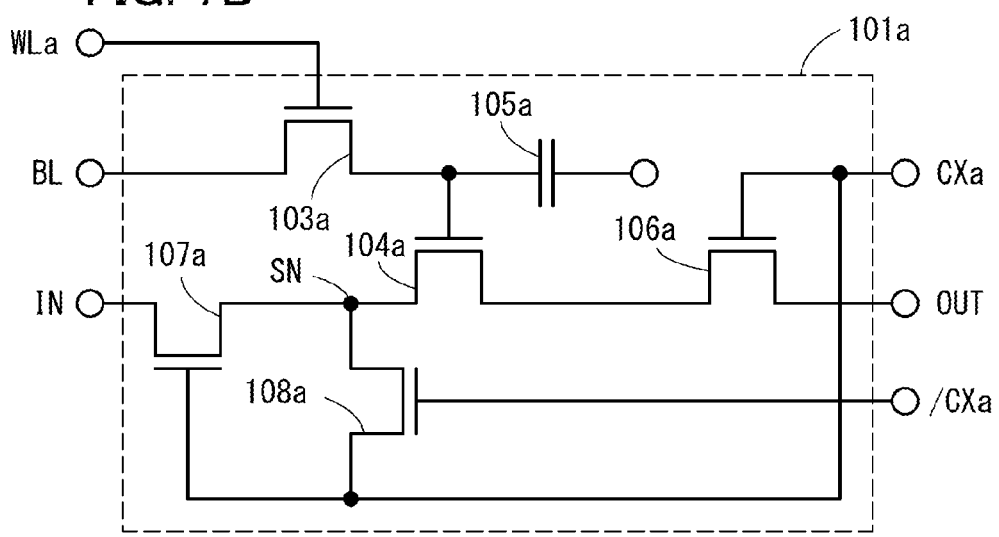

Such modification can be applied also to the programmable switches shown in FIGS. 4A and 4B and FIGS. 5A and 5B. FIG. 7B is the programmable switch 101a based on that of FIG. 5A.

FIG. 8 shows an example of the routing switch 100 comprising a plurality of programmable switches 101 (a programmable switch 101[0], a programmable switch 101[1], a programmable switch 101[2], . . . ). Each of the programmable switches 101 has the circuit structure shown in FIG. 6A. In this example, the routing switch 100 is controlled by the bit line BL, a word line WL[0], a word line WL[1], a word line WL[2], . . . , and a context line CX[0], a context line CX[1], a context line CX[2], . . . . The connection between the node IN and the node OUT is decided depending on the selected context.

Figure 9:
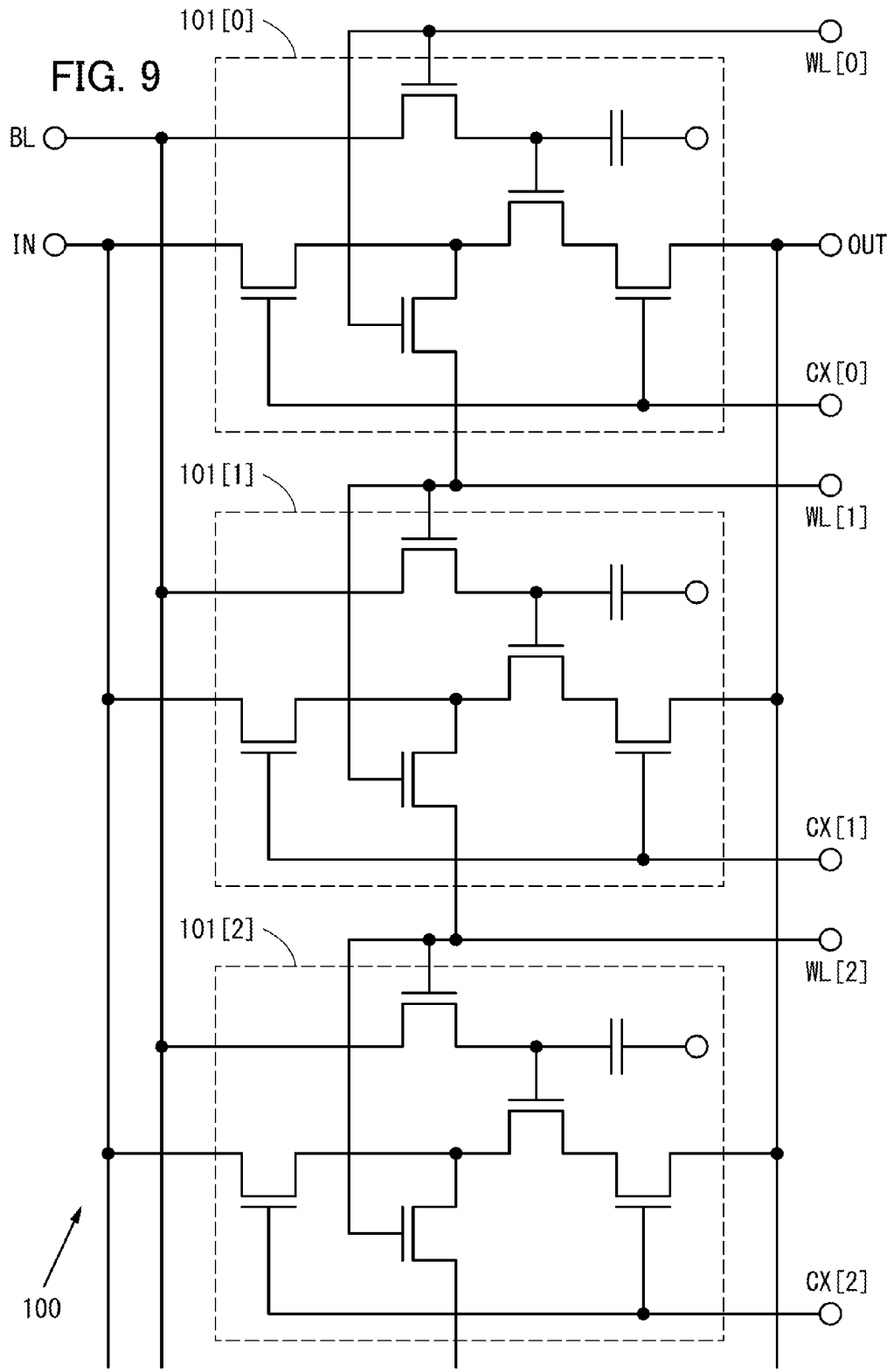
FIG. 9 shows an example of a routing switch.

FIG. 9 shows an example of the routing switch 100. The routing switch 100 of FIG. 9 is similar to that of FIG. 8, but is different in that the source node of the programmable switch 101[0] is supplied with a potential from the word line WL[1] through the precharge transistor in the programmable switch 101 [0].

When the write transistor and the precharge transistor in the programmable switch 101[0] is in on-state, the potential of the word line WL[1] may be "L" (or lower). Therefore, the potential of the source node in the programmable switch 101[0] may become "L" (or lower).

This structure is advantageous if the write transistor and the precharge transistor have the same structure, specifically, if the write transistor and the precharge transistor use wirings and films in the same layers.

Figure 10:
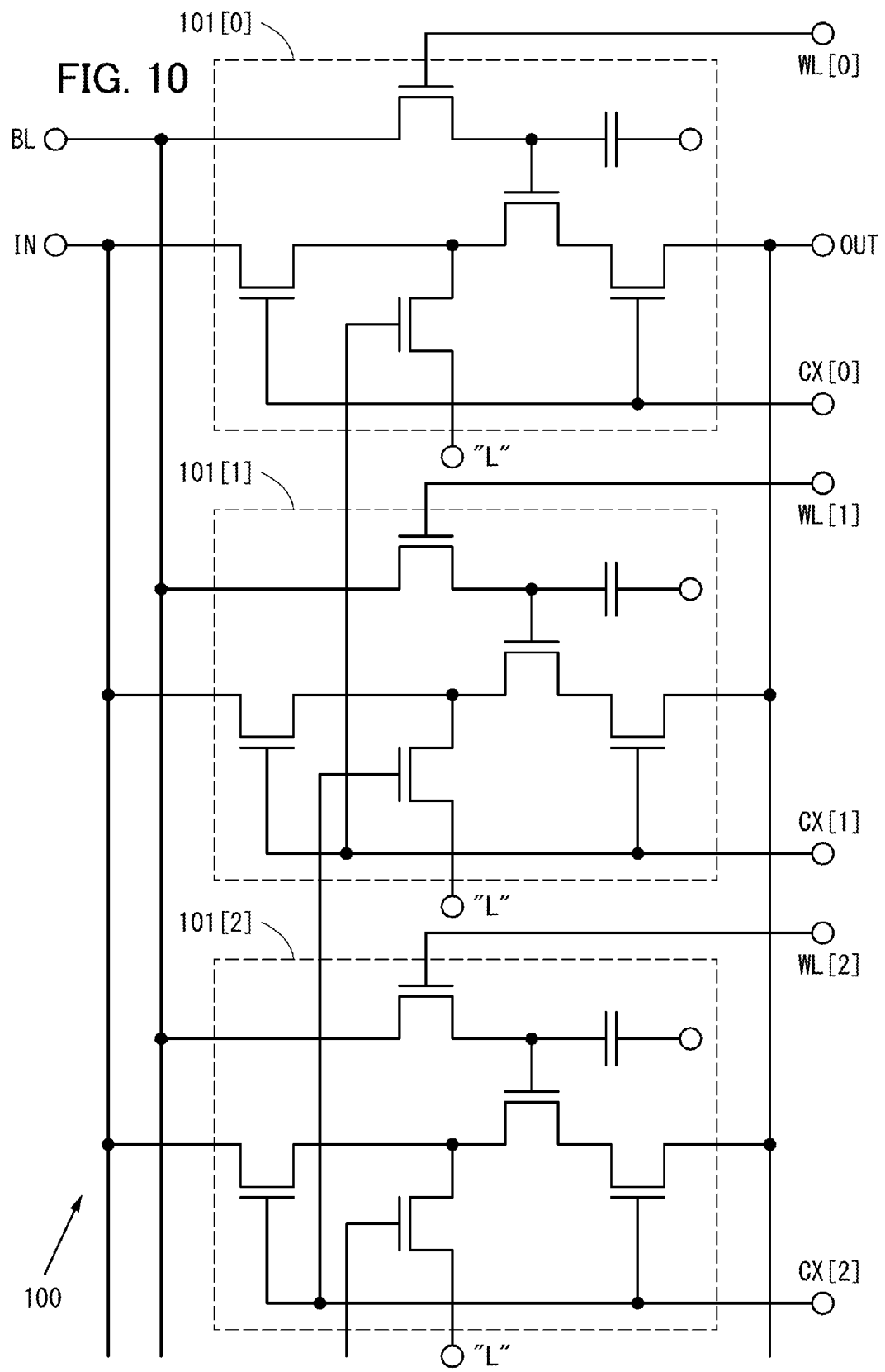
FIG. 10 shows an example of a routing switch.

FIG. 10 shows an example of the routing switch 100. The routing switch 100 of FIG. 10 is similar to that of FIG. 8, but is different in that the precharge transistor in the programmable switch 101[0] is controlled by the context line CX[1]. Accordingly, the precharge transistor in the programmable switch 101[0] is in on-state only in the period that the context of the programmable switch 101[1] is executed.

When the context of the programmable switch 101[1] is executed, the selection transistors in the programmable switch 101[0] are in off-state and the precharge transistor in the programmable switch 101[0] is in on-state. Thus, this period can be used for writing the configuration data to the programmable switch 101[0]. The more programmable switches 101 the routing switch 100 includes, the more advantageous this structure is.

Figure 4B:
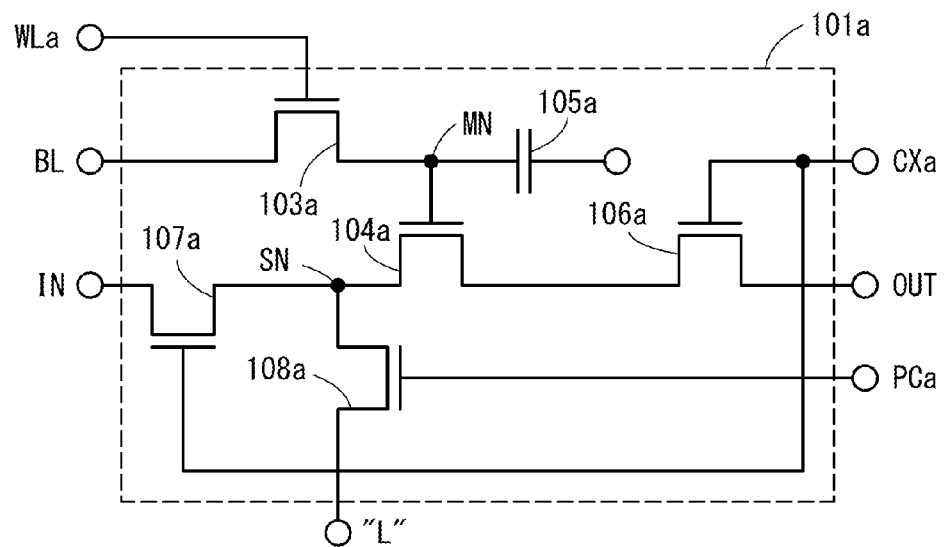
Figure 11A:
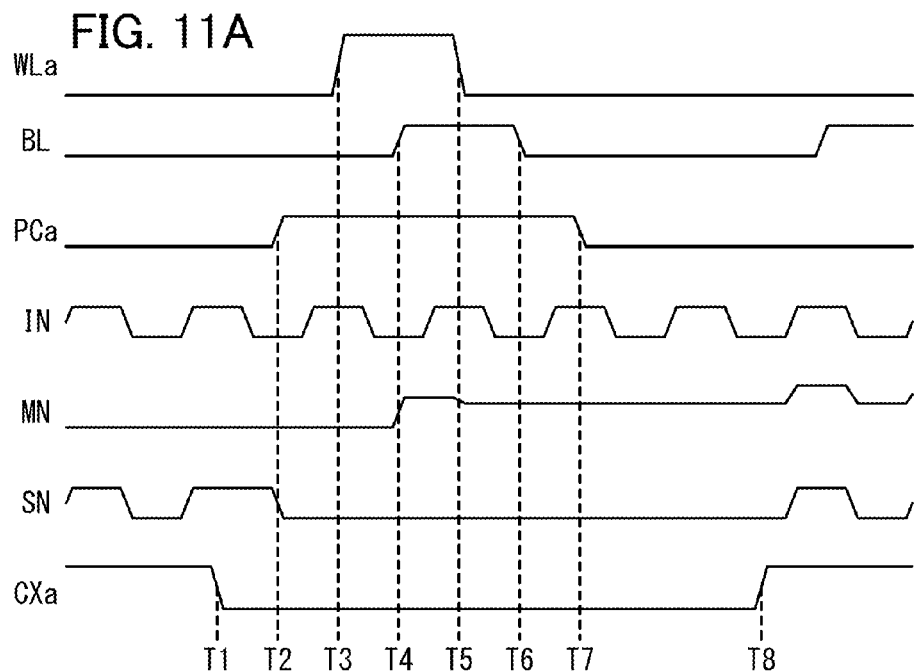
FIGS. 11A and 11B show examples for explaining operations of a programmable switch.

FIG. 11A shows an example explaining a driving method of the programmable switch 101a shown in FIG. 4B. In this example, it is supposed that the potential of the memory node MN is initially set to "L". Further, the potential of the node IN is periodically heightened and lowered in this example.

At T1, the selection transistor 106a and the selection transistor 107a are turned off. At T8, the selection transistor 106a and the selection transistor 107a are turned on. Therefore, the source and the drain of the pass transistor 104a are electrically isolated from the node IN and the node OUT in a period from T1 to T8. Therefore, this period is usable for writing the configuration data.

It should be noted that another programmable switch may be in use from T1 to T8 and another context (task) may be executed.

At T3, the write transistor 103a is turned on. At T5, the write transistor 103a is turned off. By the operation from T3 to T5, the configuration data writing is completed. In this example, the potential of the bit line BL is "H" from T4 to T6. Thus, the potential of the memory node MN becomes "H" at T4.

When the potential of the word line WLa is lowered at T5, the potential of the memory node MN may drop a little due to a capacitive coupling caused by a capacitance (mainly a parasitic capacitance) between a gate of the write transistor 103a (and the word line WLa) and the memory node MN.

After T5, the memory node MN is electrically isolated from all the wirings. This situation is called (electrically) a "floating" state. However, the memory node MN may be capacitively affected by the wirings or the conductors.

The potential of the precharge line PCa is heightened at T2 and lowered at T7. Thus, the precharge transistor 108a is turned on at T2 and turned off at T7. Consequently, the potential of the source node SN is set to "L" before the write transistor 103a is turned off.

After T8, the potential of the source node SN is periodically heightened or lowered because the selection transistor 107a is in on-state. Further, also the potential of the memory node MN changes in synchronization with the potential of the source node SN by the boosting effect.

The potential of the node OUT, although not shown in FIG. 11A, may be as high as that of the node IN if the highest potential of the memory node MN is higher than "H+Vth".

Figure 11B:
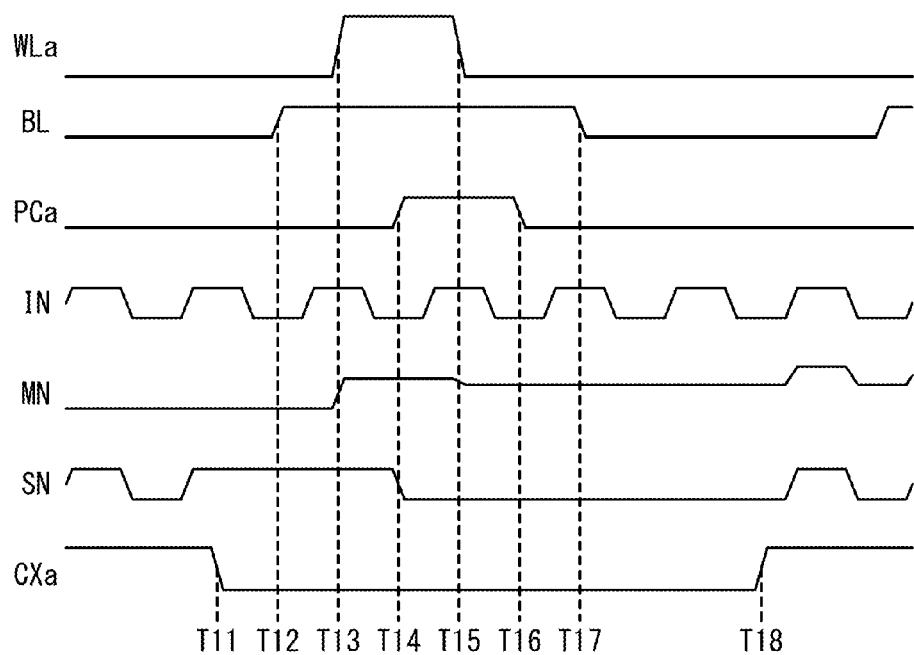
Figure 12A:
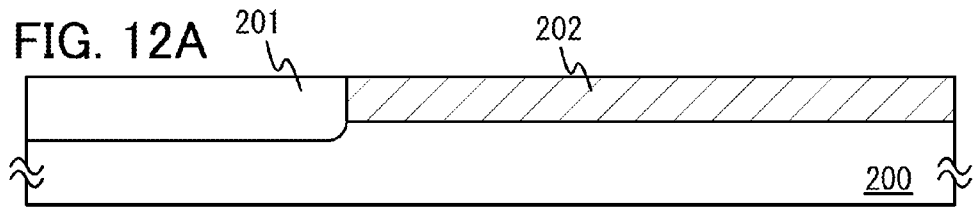
FIGS. 12A to 12D show examples of cross sectional views illustrating manufacturing steps of a semiconductor device.
Figure 12B:
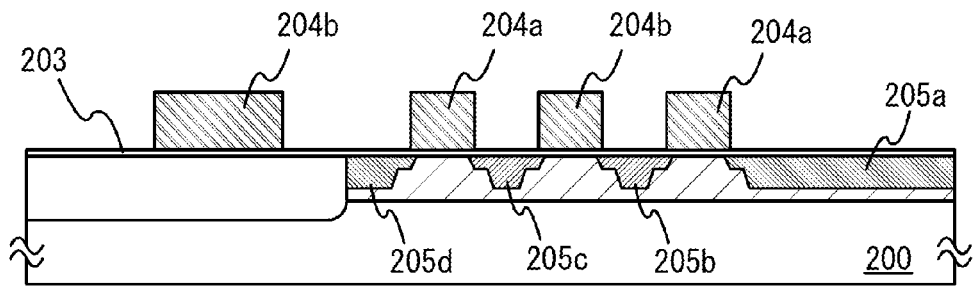
Figure 12C:
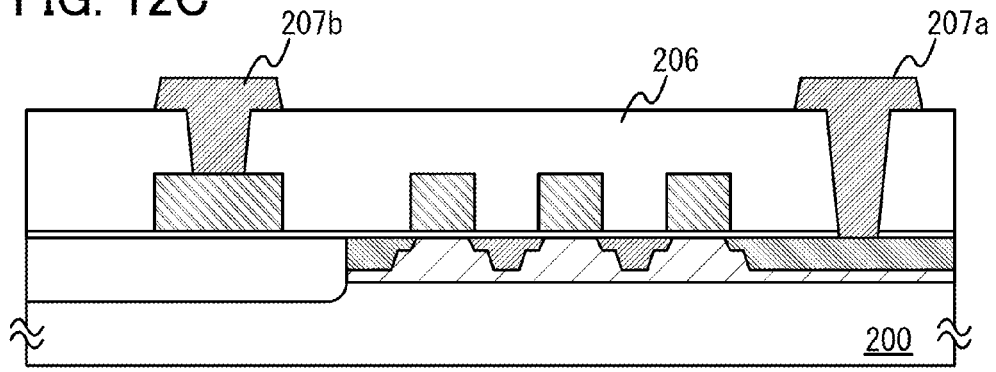
Figure 12D:
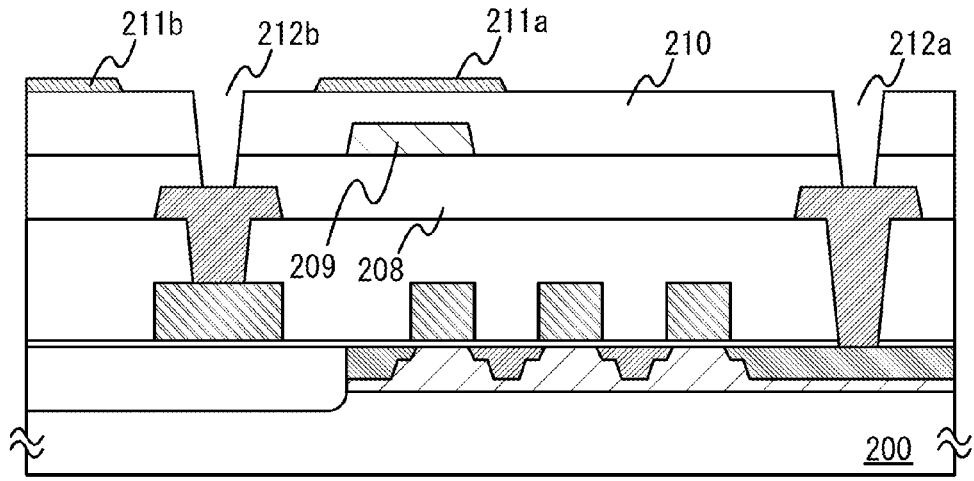
Figure 13A:
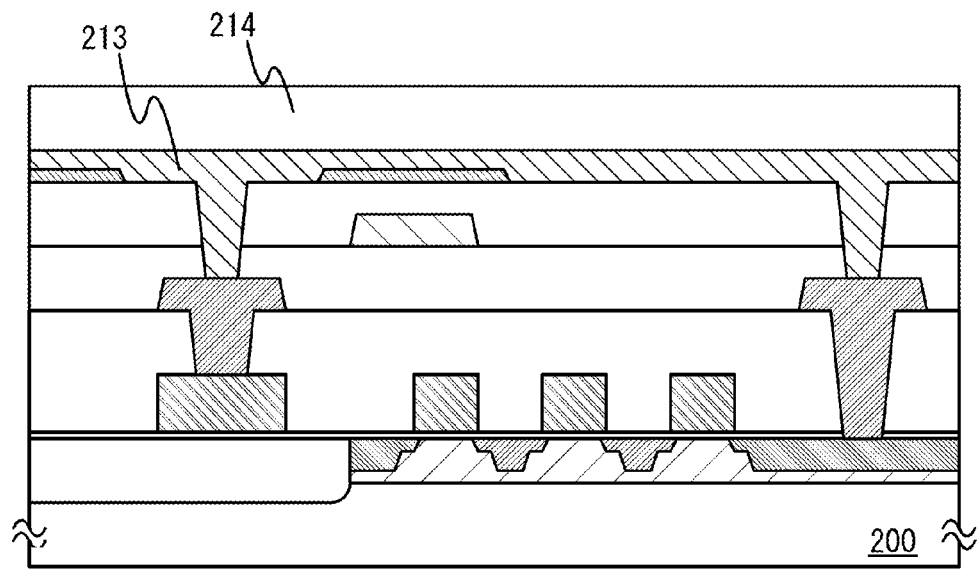
FIGS. 13A and 13B show examples of cross sectional views illustrating manufacturing steps of a semiconductor device.
Figure 13B:
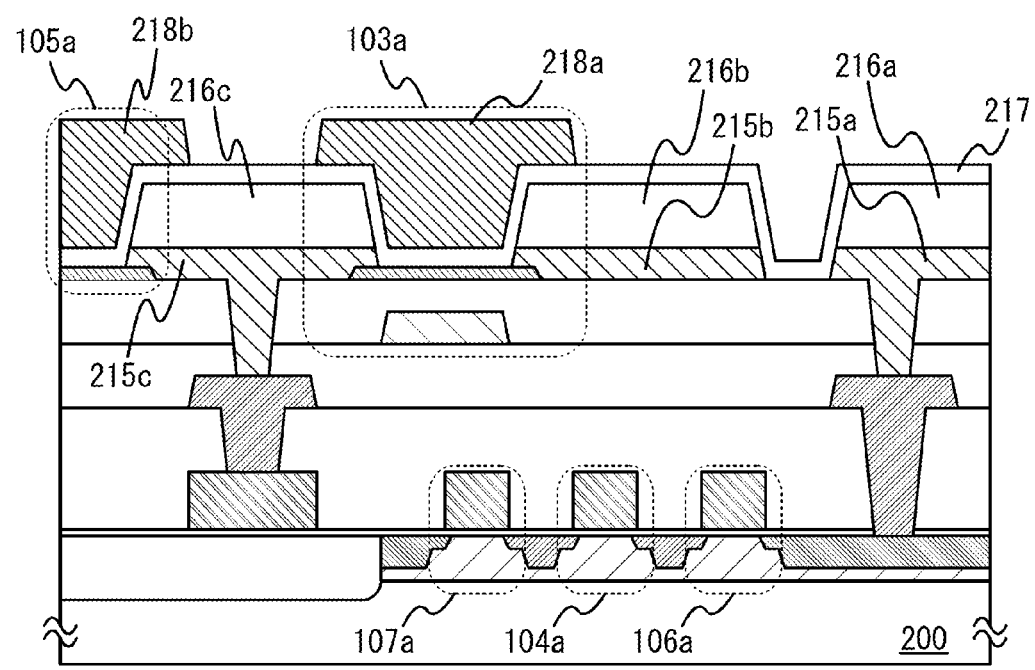

FIG. 11B shows another example. In this example, a period from T11 to T18 is usable for writing the configuration data. The signals of the bit line BL and those of the precharge line PCa in this example are the same as the signals of the precharge line PCa and those of the bit line BL in the example of FIG. 11A, respectively. Accordingly, the timing charts of the potentials of the memory node MN and the source node SN are different from those of FIG. 11A.

In these examples, the precharge transistor 108a is turned on before the write transistor 103a is turned on (FIG. 11A) or the precharge transistor 108a is turned on in the period that the write transistor 103a is in on-state (FIG. 11B), and the precharge transistor 108a is turned off after the write transistor 103a is turned off.

However, other driving methods are also usable. For example, any period from T1 to T5 in FIG. 11A or from T11 to T15 in FIG. 11B can be used for a period during which the precharge transistor 108a is in on-state.

Embodiment 2

In this embodiment, steps for manufacturing the semiconductor device in Embodiment 1 are explained using cross sectional views thereof. FIGS. 12A to 12D and FIGS. 13A and 13B show the cross sectional views. Note that FIGS. 12A to 12D and FIGS. 13A and 13B do not show any specific real cross sectional views, because FIGS. 12A to 12D and FIGS. 13A and 13B are only for understanding a layered structure of the semiconductor device.

(FIG. 12A)

An element isolation region 201 is formed on a semiconductor substrate 200. The semiconductor substrate 200 may be a single crystalline silicon substrate or a silicon-on-insulator (SOI) substrate, for example. The semiconductor substrate 200 may be lightly doped with an n-type dopant, or may be intrinsic. The element isolation region 201 may be formed by a shallow trench isolation (STI) technique, for example.

Then, a p-type region 202 is formed at a region where the element isolation region 201 is not formed.

(FIG. 12B)

A gate insulator 203 is formed over the element isolation region 201 and the p-type region 202. The gate insulator 203 may be formed only over the p-type region 202. The gate insulator 203 may be made of silicon oxide, hafnium oxide, and/or other oxides, for example.

A wiring 204a and a wiring 204b are formed over the gate insulator 203. Two cross sections of the wiring 204a (and of the wiring 204b) are shown in this view. This means that the wiring 204a has two cross sections at this section and that these cross sections show those of a single object.

The wiring 204a and the wiring 204b may be made of metals and/or doped silicon. In one example, the wiring 204a and the wiring 204b may be formed by selective etching of a single-layered or multi-layered conductive film. In this example, the wiring 204a and the wiring 204b is isolated with each other (not contact with each other).

The wiring 204a and the wiring 204b may correspond to (a part of) the context line CXa and (a part of) the memory node MN in FIG. 4B, 5A, 5B, 6A, 6B, 7A or 7B, respectively.

An n-type region 205a, an n-type region 205b, an n-type region 205c and an n-type region 205d are formed using the wiring 204a and the wiring 204b as doping masks. The n-type region 205c may correspond to (a part of) the source node SN in FIG. 4B, 5A, 5B, 6A, 6B, 7A or 7B. Before or after this step, part of the gate insulator 203 may be etched.

(FIG. 12C)

An interlayer insulator 206 is formed over the gate insulator 203, the wiring 204a and the wiring 204b. The interlayer insulator 206 may be made of silicon oxide, silicon oxide carbon, and/or other metal oxides, for example. The interlayer insulator 206 may contain some voids for reducing a dielectric constant.

A surface of the interlayer insulator 206 may be polished and leveled. A wiring 207a and a wiring 207b are formed after forming contact holes in the interlayer insulator 206. The wiring 207a and the wiring 207b may correspond to (a part of) the node OUT and (a part of) the memory node MN in FIG. 4B, 5A, 5B, 6A, 6B, 7A or 7B, respectively.

(FIG. 12D)

An interlayer insulator 208 is formed over the interlayer insulator 206, the wiring 207a and the wiring 207b. A surface of the interlayer insulator 208 may be polished and leveled. A wiring 209 is formed over the interlayer insulator 208. Further, an interlayer insulator 210 is formed over the interlayer insulator 208 and the wiring 209. A surface of the interlayer insulator 210 may be polished and leveled.

An oxide semiconductor film 211a and an oxide semiconductor film 211b are formed over the interlayer insulator 210. The oxide semiconductor film 211a overlaps with the wiring 209. The oxide semiconductor film 211a and the oxide semiconductor film 211b may be made of In—Ga—Zn oxide. A contact hole 212a to the wiring 207a and a contact hole 212b to the wiring 207b are formed by etching the interlayer insulator 208 and the interlayer insulator 210.

(FIG. 13A)

A single-layered or multi-layered conductive layer 213 is formed over the interlayer insulator 210, the oxide semiconductor film 211a and the oxide semiconductor film 211b to cover them and to fill the contact hole 212a and the contact hole 212b. A surface of the conductive layer 213 is polished and leveled. Further a single-layered or multi-layered insulator 214 is formed over the conductive layer 213. A surface of the insulator 214 is polished and leveled.

(FIG. 13B)

By one-time lithography, the conductive layer 213 and the insulator 214 are selectively etched to form a wiring 215a, a wiring 215b, a wiring 215c, a patterned insulator 216a over the wiring 215a, a patterned insulator 216b over the wiring 215b and a patterned insulator 216c over the wiring 215c. The wiring 215a, the wiring 215b and the wiring 215c may correspond to (a part of) the node OUT, (a part of) the bit line BL and (a part of) the memory node MN in FIG. 4B, 5A, 5B, 6A, 6B, 7A or 7B, respectively.

The shapes of the wiring 215a, the wiring 215b and the wiring 215c are substantially the same as those of the patterned insulator 216a, the patterned insulator 216b and the patterned insulator 216c, respectively. By this etching, the oxide semiconductor film 211a and the oxide semiconductor film 211b are exposed.

A gate insulator 217 is formed over the interlayer insulator 210, the oxide semiconductor film 211a, the oxide semiconductor film 211b, the wiring 215a, the wiring 215b, the wiring 215c, the patterned insulator 216a, the patterned insulator 216b and the patterned insulator 216c.

Then a wiring 218a and a wiring 218b are formed to cover the oxide semiconductor film 211a and the oxide semiconductor film 211b, respectively. The wiring 218a may correspond to (a part of) the word line WLa in FIG. 4B, 5A, 5B, 6A, 6B, 7A or 7B.

As a result, the write transistor 103a, the pass transistor 104a, the capacitor 105a, the selection transistor 106a and the selection transistor 107a in FIG. 4B, 5A, 5B, 6A, 6B, 7A or 7B are formed. The precharge transistor 108a, although not shown in these cross sections, can be formed in the same way. The precharge transistor 108a may have the structure like the write transistor 103a, or the structure like the pass transistor 104a.

In this example, the capacitor 105a has a metal-insulator-semiconductor (MIS) structure, but it may be formed using a metal-insulator-metal (MIM) structure. In order to obtain sufficient capacitance regardless of the potential of the memory node MN, the potential of the wiring 218b may be higher than "H" plus the threshold voltage of the capacitor 105a. If the threshold voltage is less than 0 V, the applied potential to the wiring 218b can be "H", and if the threshold voltage is less than "L–H", the applied potential to the wiring 218b can be "L".

Such a low threshold voltage is advantageous in that the electron injection from the oxide semiconductor to the gate insulator 217 can be avoided because no higher potential is needed for the wiring 218b. The electron injection brings threshold voltage rise and causes capacitance decrease.

Regarding the hole injection by applying the lower potential, the oxide semiconductors, especially, the oxide semiconductors including indium (In), gallium (Ga) or zinc (Zn) do not emit holes due to their heavy effective mass. Accordingly, the degradation by the hole injection is negligible.

The above properties are favorable for the capacitor, but are not favorable for the transistor. The low threshold voltage of the capacitor 105a means that the threshold voltage of the write transistor 103a is low, too, because their structures are similar. Therefore, applying a lower potential to a back gate (described below) or the word line WLa is needed.

In the write transistor 103a, the patterned insulator 216b/the patterned insulator 216c are provided between the wiring 218a and the wiring 215b/the wiring 215c. Therefore, parasite capacitance between the wiring 218a and the wiring 215b/the wiring 215c can be reduced.

The write transistor 103a comprises two gate electrodes, i.e., the wiring 209 and the wiring 218a. The wiring 209 may be used as a back gate of the write transistor 103a for controlling the threshold voltage of the write transistor 103a.

By applying a lower (fixed) potential than "L" to the wiring 209, the threshold voltage of the write transistor 103a can be heightened. Accordingly, the source-drain current can be reduced to less than 1 zA when "L" is applied to the word line WLa (the wiring 218a). The similar effect can be obtained by applying a lower potential than "L" to the word line WLa, even without the back gate.

Another wirings and interlayer insulators may be formed.

Embodiment 3

In this embodiment, an example of a semiconductor device comprising programmable switches (FPGA) is explained.

Figure 14:
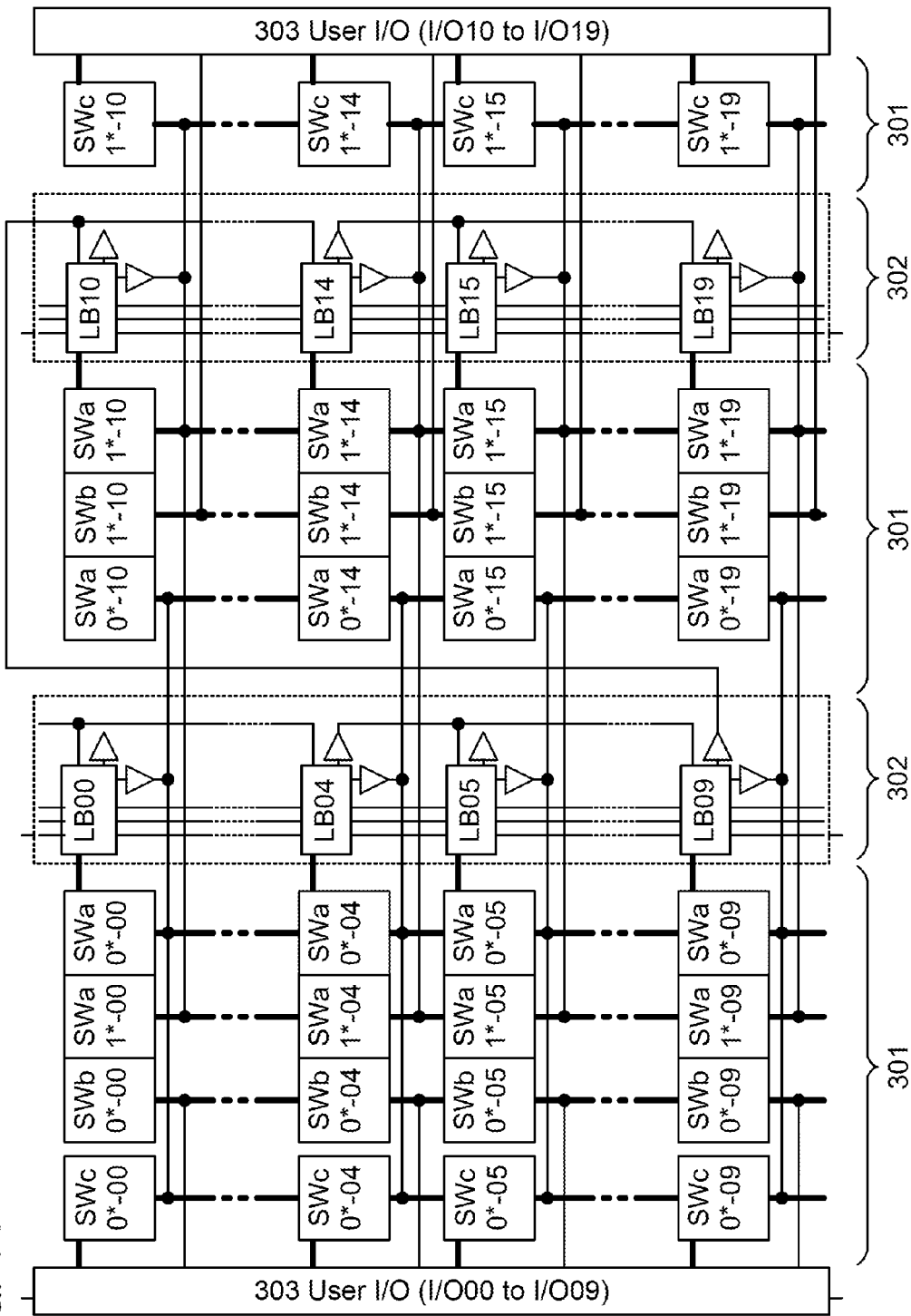
FIG. 14 shows an example of an FPGA.

FIG. 14 is a block diagram illustrating an example of an FPGA comprising switch arrays 301, logic arrays 302 and I/O arrays 303.

Each of the switch arrays 301 is a circuit block including a plurality of routing switches (SWa, SWb and SWc) arranged in a matrix. Each of the routing switches includes a plurality of programmable switches as shown in FIG. 8 in order to store a plurality of contexts.

Each of the logic arrays 302 includes a plurality of logic blocks arranged in an array. In the example of FIG. 14, each of the logic arrays 302 includes ten logic blocks (LB00 to LB09) arranged in a line. Each logic block includes a memory for storing configuration data.

The I/O arrays 303 is provided both ends of the FPGA and each of them includes ten input/output circuits (I/O00 to I/O09 and I/O10 to I/O19) arranged in an array.

The routing switch SWa controls connection between the logic blocks. For example, "SWa0*-00" means that an output of any of the logic blocks LB00 to LB09 and an input of the logic block LB00 can be connected or disconnected by this routing switch.

The routing switch SWb controls connection between input terminals of the logic blocks and the input/output circuits. For example, "SWb0*-00" means that any of the input/output circuits I/O00 to I/O09 and the input of the logic block LB00 can be connected or disconnected by this routing switch.

The routing switch SWc controls connection between output terminals of the logic blocks and the input/output circuits. For example, "SWc0*-00" means that any of the input/output circuits I/O00 to I/O09 and the output of the logic block LB00 can be connected or disconnected by this routing switch.

Figure 15A:
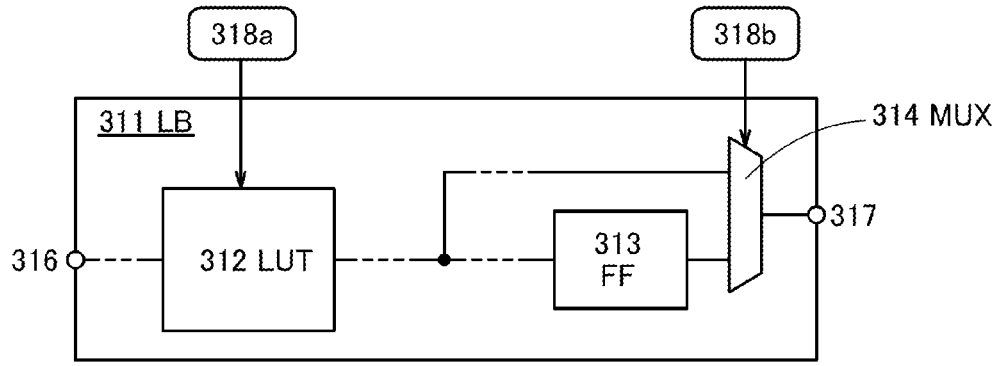
FIGS. 15A to 15C show examples of logic blocks.

Generally, a logic block includes one or more look-up tables (LUT), one or more flip-flops (FF) and one or more multiplexers (MUX). FIG. 15A is a block diagram illustrating a structure example of a logic block 311. The logic block 311 includes a look-up table 312, a flip-flop 313, and a multiplexer 314.

Configuration data 318a including information for specifying the function of the look-up table 312 as a logic gate is input to the look-up table 312. In other words, a logic level (e.g., "1"/"0", or "H"/"L") of a signal output from the look-up table 312 is determined in accordance with the configuration data 318a and a logic level of a signal input from an input terminal 316 to the look-up table 312.

The signal output from the look-up table 312 is input to the flip-flop 313. A signal output from one flip-flop 313 included in one logic block 311 may be input to another flip-flop 313 included in another logic block 311. The flip-flop 313 has a function of holding these input signals.

Configuration data 318b including information for controlling the operation of the multiplexer 314 is input to the multiplexer 314. The multiplexer 314 has a function of selecting any one of signals output from the look-up table 312 and the flip-flop 313 in accordance with the configuration data 318b. The signal selected by the multiplexer 314 is output from an output terminal 317 of the logic block 311.

Figure 15B:
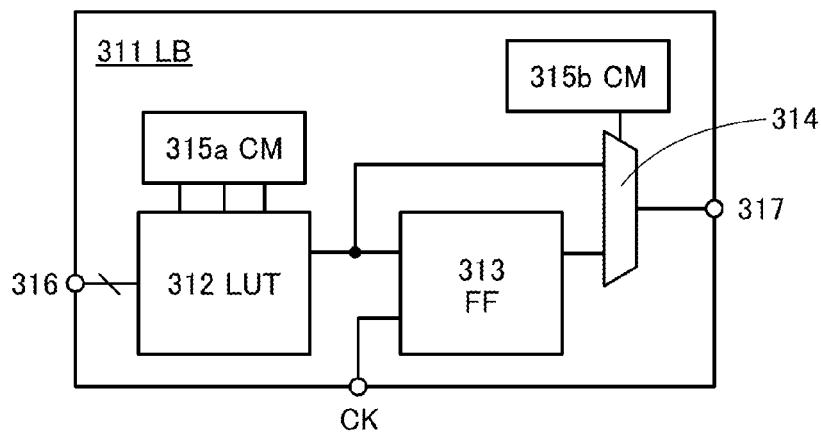

FIG. 15B illustrates a specific structure example of the logic block 311 in FIG. 15A. The logic block 311 in FIG. 15B includes the look-up table 312, the flip-flop 313, the multiplexer 314, a configuration memory 315a that stores the configuration data 318a for the look-up table 312, and a configuration memory 315b that stores the configuration data 318b for the multiplexer 314.

Logical operation executed by the look-up table 312 varies depending on the configuration data 318a stored in the configuration memory 315a. When the logical operation executed by the look-up table 312 is determined by the configuration data 318a, the look-up table 312 generates an output signal corresponding to a plurality of input signals supplied to the input terminal 316. The flip-flop 313 holds the output signal generated in the look-up table 312 and outputs an output signal corresponding to the output signal of the look-up table 312 in synchronization with clock signals CK.

Signals output from the look-up table 312 and the flip-flop 313 are input to the multiplexer 314. The multiplexer 314 has a function of selecting and outputting one of these two kinds of output signals in accordance with the configuration data 318b stored in the configuration memory 315b. A signal output from the multiplexer 314 is supplied to the output terminal 317.

Figure 15C:
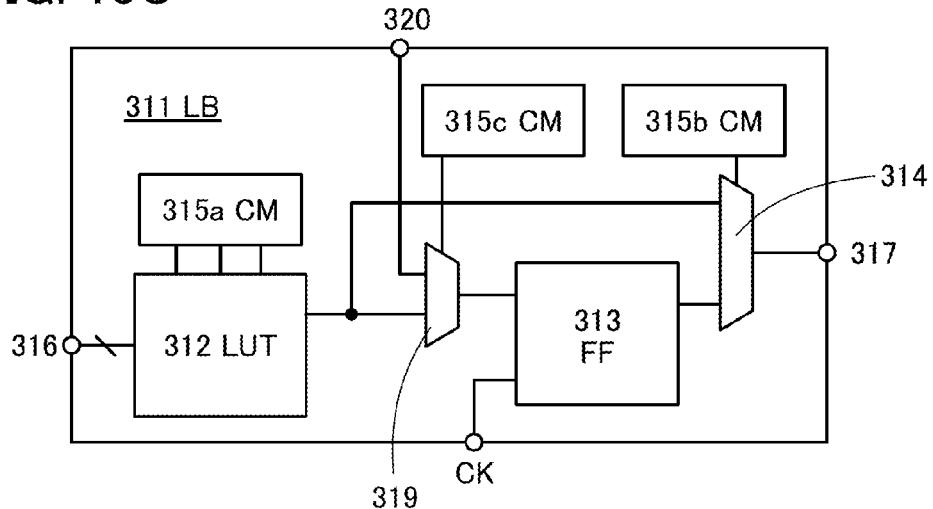

FIG. 15C illustrates another specific structure example of the logic block 311 in FIG. 15A. The logic block 311 in FIG. 15C differs from the logic block 311 in FIG. 15B in including a multiplexer 319 and a configuration memory 315c that stores configuration data for the multiplexer 319.

A signal output from the look-up table 312 and a signal output from the flip-flop 313 included in another logic block 311 are input to the multiplexer 319. The signal output from the flip-flop 313 included in the other logic block 311 is input from an input terminal 320. The multiplexer 319 has a function of selecting and outputting one of these two output signals in accordance with configuration data stored in the configuration memory 315c.

In the logic block 311 in FIG. 15C, the flip-flop 313 holds the signal output from the multiplexer 319 and outputs an output signal corresponding to the signal output from the multiplexer 319 in synchronization with the signal CK.

Note that in the logic block 311 illustrated in FIG. 15B or 15C, configuration data may determine usable types of the flip-flop 313. Specifically, the flip-flop 313 may be any of a D flip-flop, a T flip-flop, a JK flip-flop, and an RS flip-flop, depending on configuration data.

Example

Performance of the FPGA shown in Embodiment 3 was simulated using Synopsys XA (registered trademark) as a SPICE simulator. In this simulation, two kinds of the programmable switches, one was that shown in FIG. 1B and the other was that shown in FIG. 6A, were examined.

It was supposed that 20 logic blocks, 20 input/output terminals (I/O[0] to I/O[19]) and 2 contexts (Context[1] and Context[2]) are provided in the FPGA. Further, it was supposed that various tasks (Task[0], Task[1], . . . ) are executable. In the simulation, a global clock frequency of 33 MHz at 2.5 V was supposed.

Figure 16A:
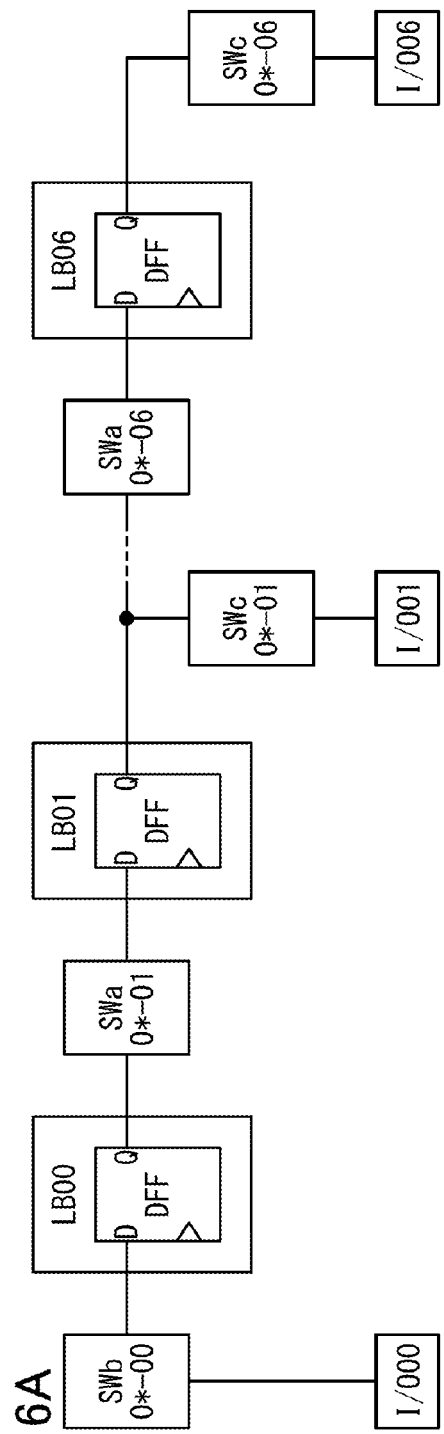
FIGS. 16A and 16B show a shifter and of a ring oscillator, respectively, that are circuits configured in Example.
Figure 16B:
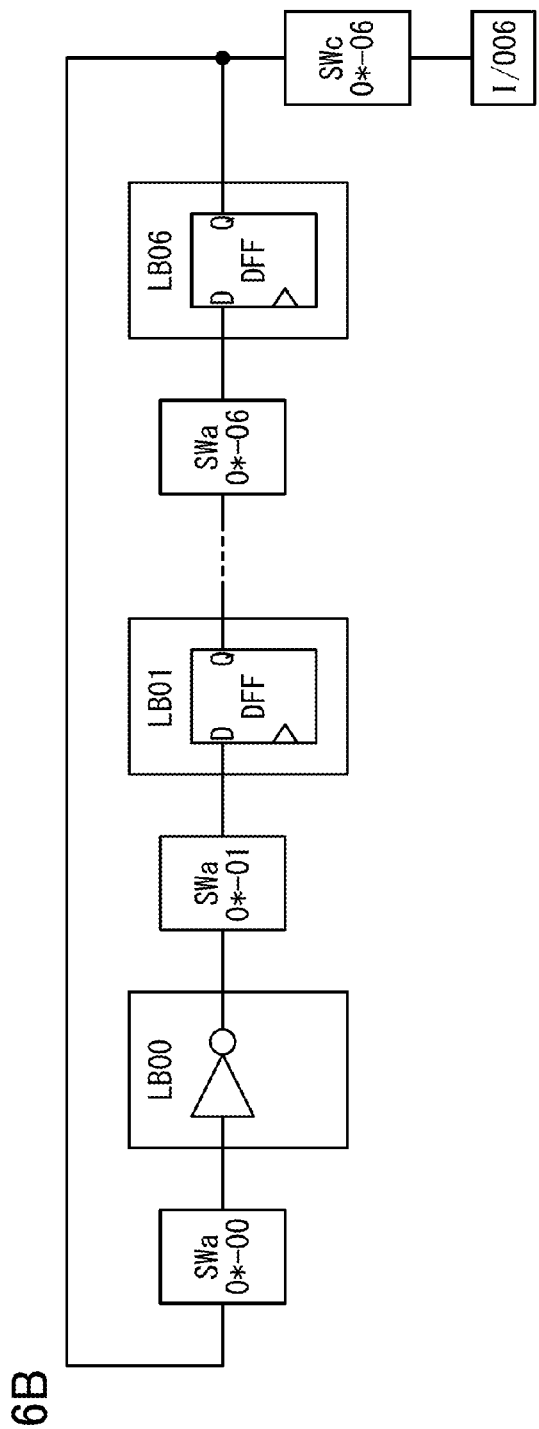

In the simulation, after initialization, a part of the FPGA was configured as a shifter circuit. That is, the configuration data corresponding to Context[0] for executing the shifter circuit were written to the FPGA to work as Task[0]. The shifter circuit is shown in FIG. 16A. During Task[0], the part of the FPGA was configured as a ring oscillator. That is, the configuration data corresponding to Context[1] for executing the ring oscillator were written to the FPGA to work as Task[1] after Task[0]. The (seven-stage) ring oscillator is shown in FIG. 16B. The configuration as the ring oscillator was conducted without interrupting Task[0].

Supposing the logic block 311 shown in FIG. 15B, for configuration as the shifter circuit, the look-up table 312 was configured to output signals to the flip-flop 313 only depending on a specific input signal and the multiplexer 314 was configured to pass only the output of the flip-flop 313.

Similarly, for configuring as the ring oscillator, the look-up table 312 was configured to output reverse signals to the multiplexer 314 only depending on a specific input signal, and the multiplexer 314 was configured to pass only the output of the look-up table 312.

The configuration data corresponding to Context[1] were written in a corresponding programmable switch in each of the routing switches during Task[0].

During Task[0], the shifter circuit outputs pulse signals shown in FIG. 17A or step signals shown in FIG. 17B depending on input signals from I/O00. Therefore, at the reconfiguration from the shifter circuit to the ring oscillator, the potentials of the source nodes of the programmable switches varied depending on the shifter circuit's output.

The reconfiguration started at T0 as shown in FIGS. 17A and 17B. At T0, a potential of the output of each logic block was "L" when the shifter circuit output pulse signals, while the potential was "H" when the shifter circuit output step signals.

Figure 18A:
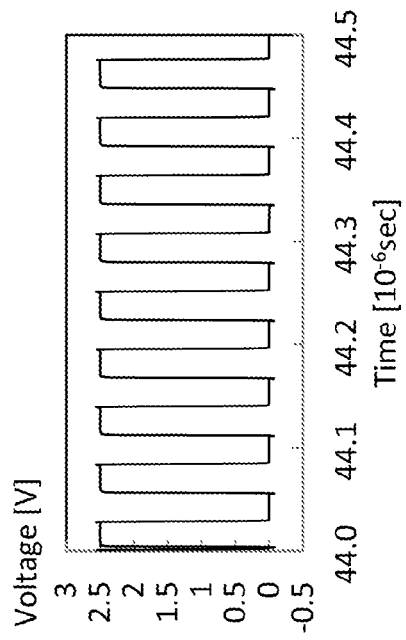
FIGS. 18A to 18D show simulated properties of a ring oscillator in Example.
Figure 18C:
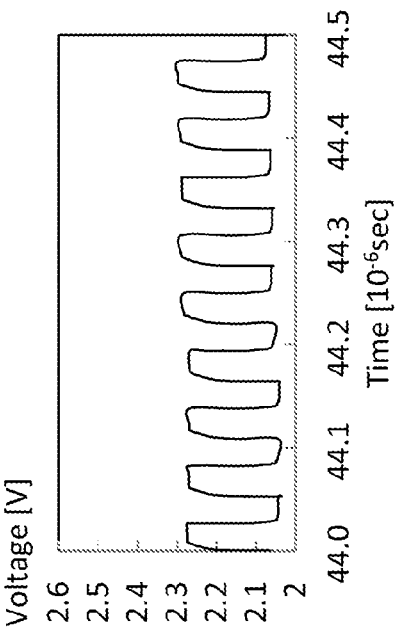

FIGS. 18A and 18C show simulated outputs of I/O06, i.e., oscillation waves of the ring oscillator during Task[1], using the programmable switch shown in FIG. 1B. FIG. 18A shows outputs of that configured at T0 of FIG. 17A, i.e., when the potential at the source node was "L" while FIG. 18C shows outputs of that configured at T0 of FIG. 17B, i.e., when the potential of the source node was "H".

In FIGS. 18A and 18C, the oscillation frequencies were 21 MHz and 13 MHz, respectively. This was caused by difference in on-state resistance. When response speed of the signals varies by some reasons like this, the operation of the circuit is set based on the most delayed signals. In this case, the operation of the circuit is set based on 13 MHz.

Figure 18B:
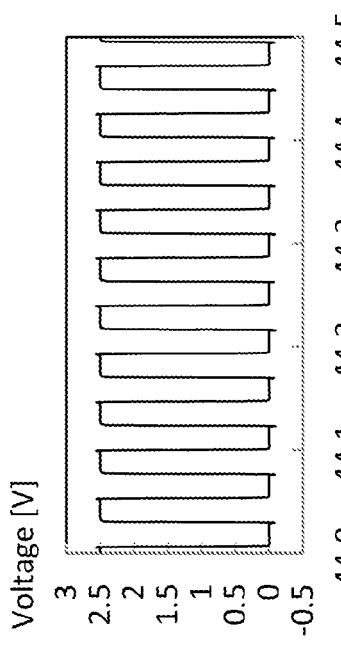
Figure 18D:
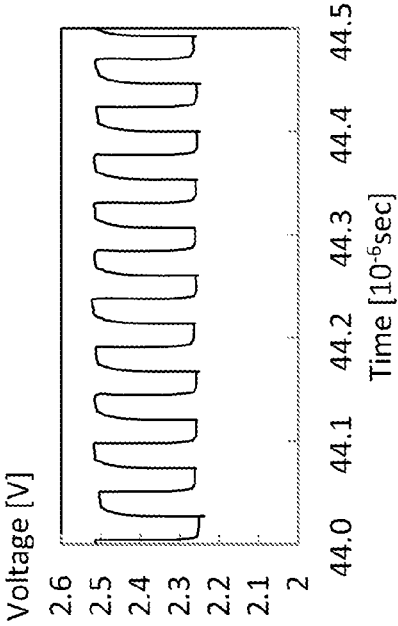

FIGS. 18B and 18D show simulated potentials of a memory node of a corresponding programmable switch, using the routing switch 100 shown in FIG. 1B, during Task[1]. FIGS. 18B and 18D correspond to FIGS. 18A and 18C, respectively. As can be seen, the boosting effect and the reverse boosting effect made the difference between the outputs in both figures so that the potential of that configured under the condition that the potential at the source node was "L" (FIG. 18B), is higher than the other potential.

Figure 19A:
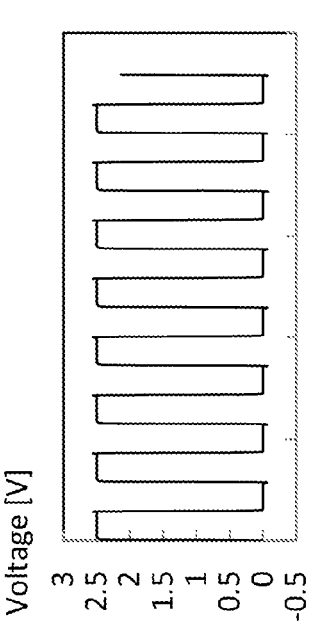
FIGS. 19A to 19D show simulated properties of a ring oscillator in Example.
Figure 19C:
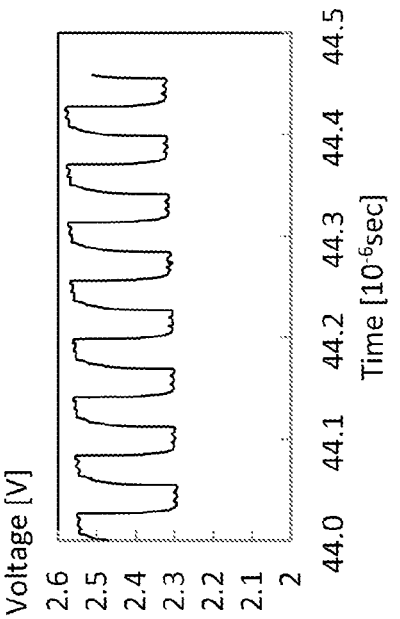

FIGS. 19A to 19D show performance of an FPGA comprising the programmable switches of FIG. 6A. FIGS. 19A and 19C show simulated outputs of I/O06, during Task[1]. FIG. 19A shows that configured under the pulse signal while FIG. 19C is that under the step signal. The oscillation frequencies for both cases were 18 MHz.

The potential of the outputs is lower than that of FIG. 18A but higher than that of FIG. 18C. In the circuit shown in FIG. 1B, its operation is set in view of the response speed decided by the oscillation frequency shown in FIG. 18C (13 MHz) while, in the circuit shown in FIG. 6A, its operation is set in view of the response speed decided by the oscillation frequency shown in FIGS. 19A and 19C (18 MHz). Accordingly, more high speed operation can be achieved.

Figure 19B:
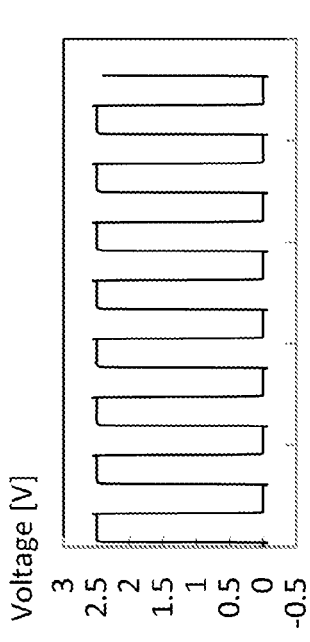
Figure 19D:
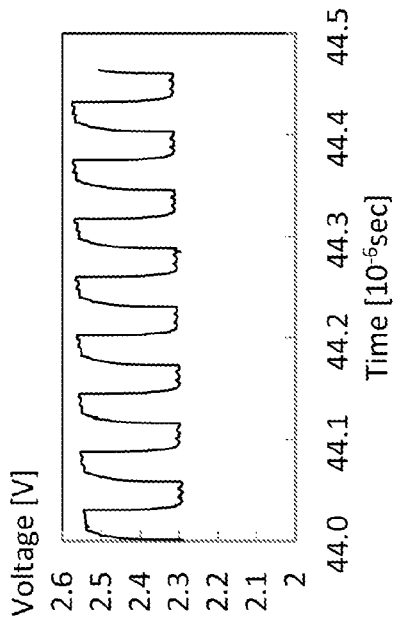

FIGS. 19B and 19D show simulated potentials of the memory node of the corresponding programmable switch during Task[1]. FIGS. 19B and 19D correspond to FIGS. 19A and 19C, respectively, and there was no substantial difference.

Comparing FIG. 1B and FIG. 6A, the latter is disadvantageous in operating speed or signal strength because it needs an extra transistor, the selection transistor 107a. An overdrive of the context signal for improving strength of the output signal and decrease propagation delay was simulated.

Figure 20:
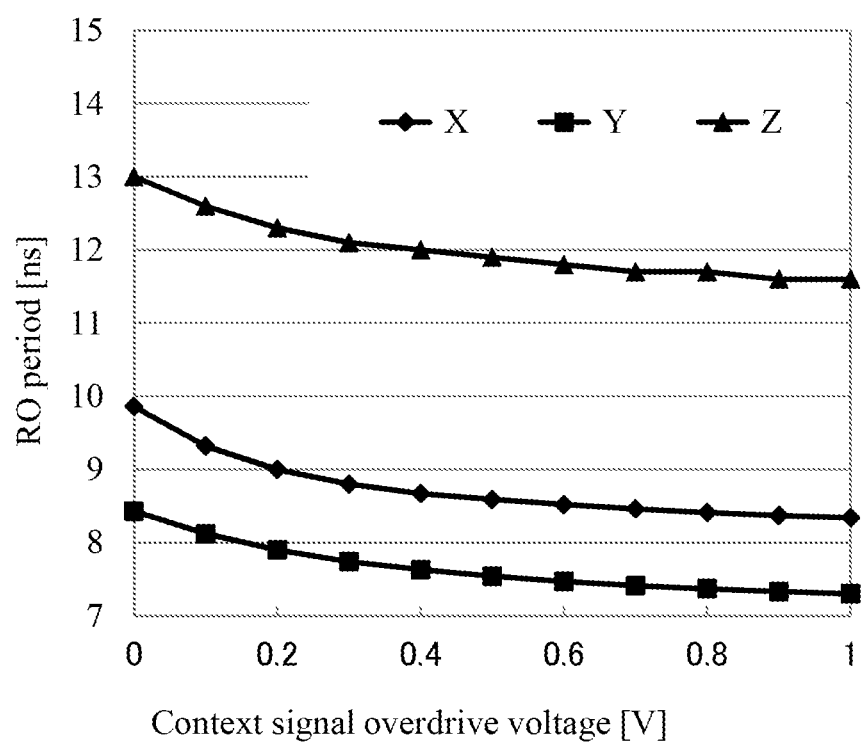
FIG. 20 shows simulated properties of the ring oscillator in Example.

FIG. 20 shows how the period changes with respect to the programmable switch of FIG. 1B and the programmable switch of FIG. 6A when the context signal was overdriven in a 7-stage ring oscillator during Task[1]. As can be seen, the programmable switch of FIG. 6A (the curve X) had a longer period than the programmable switch of FIG. 1B which was configured at "L" (the curve Y), but had a much shorter period than the programmable switch of FIG. 1B configured at "H" (the curve Z).

Next, another simulation was performed for the case where the FPGA loads three different programs. Those are an incremental shifter that shifts a signal from I/O [0] to I/O [19] (Task[0]), a decremental shifter that shifts a signal from I/O [19] to I/O [0] (Task[1]), and a divider that converts frequency of I/O[i] into half of frequency of I/O[i−1] (Task[2]).

Figure 22:
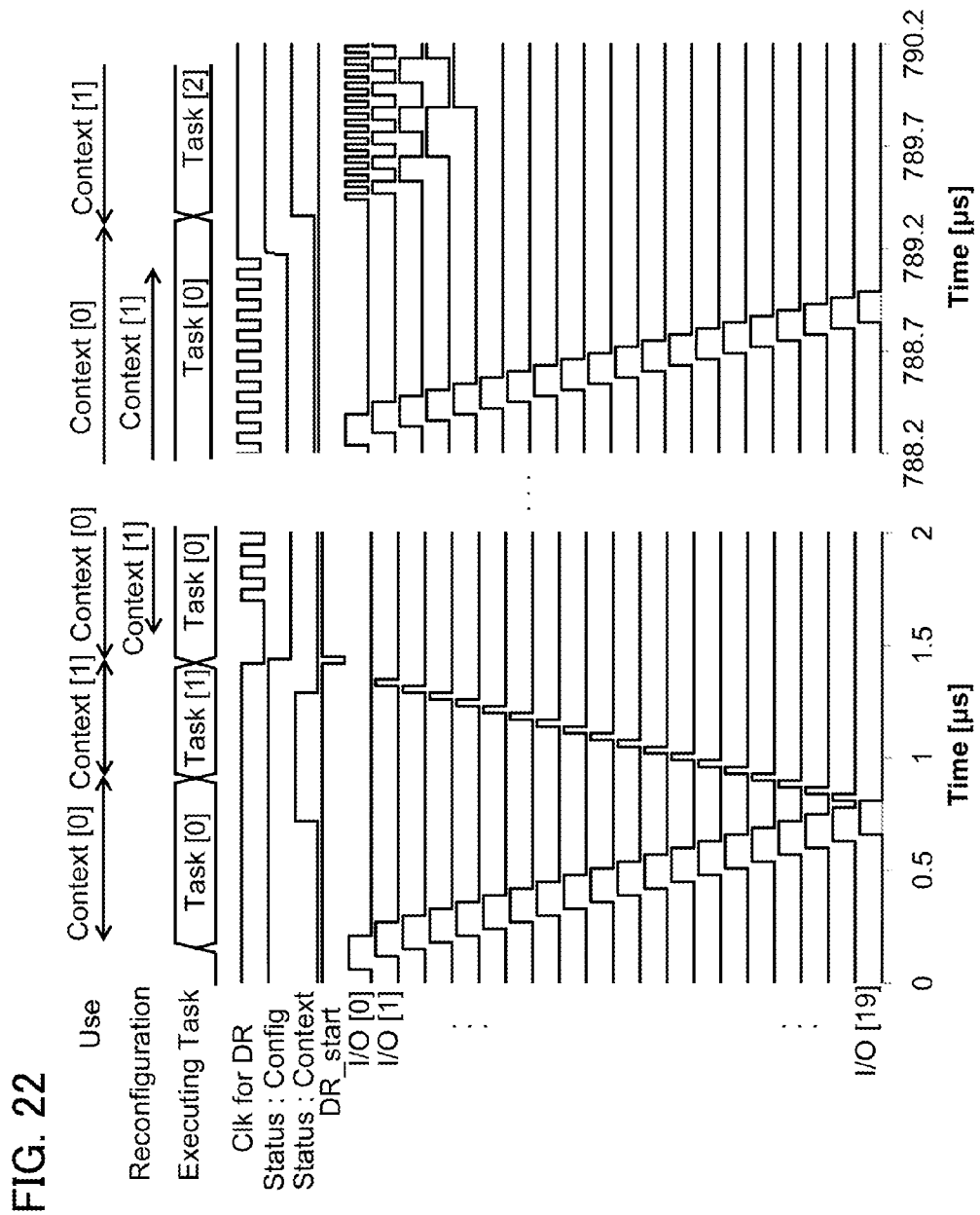
FIG. 22 shows simulated properties of a semiconductor device in Example.

First, a task corresponding to an initial configuration is performed at a time when Task [0] and Task [1] are stored in Context[0] and in Context[1], respectively. After Context[0] was conducted, Context[1] followed. Then, Context[0] was conducted once more while Context[1] was reconfigured to hold Task[2]. Upon the finish of the reconfiguration, Context [1] was conducted at last. The results of the simulation are shown in FIG. 22, in which it can be seen that the contexts were clearly switched, and how Context[1] changed from its initial configuration as a shifter to a configuration as a divider while the FPGA executed Context[0].

Next, properties of an FPGA including the programmable switch 101a shown in FIG. 4B were compared with those of an SRAM-based FPGA. Most of commercial FPGAs are SRAM-based. The evaluation was performed on a constituted 53-stage ring oscillator with each type of the routing switches. It was supposed that capacitance of the capacitor 105a is 4 fF.

Figure 23:
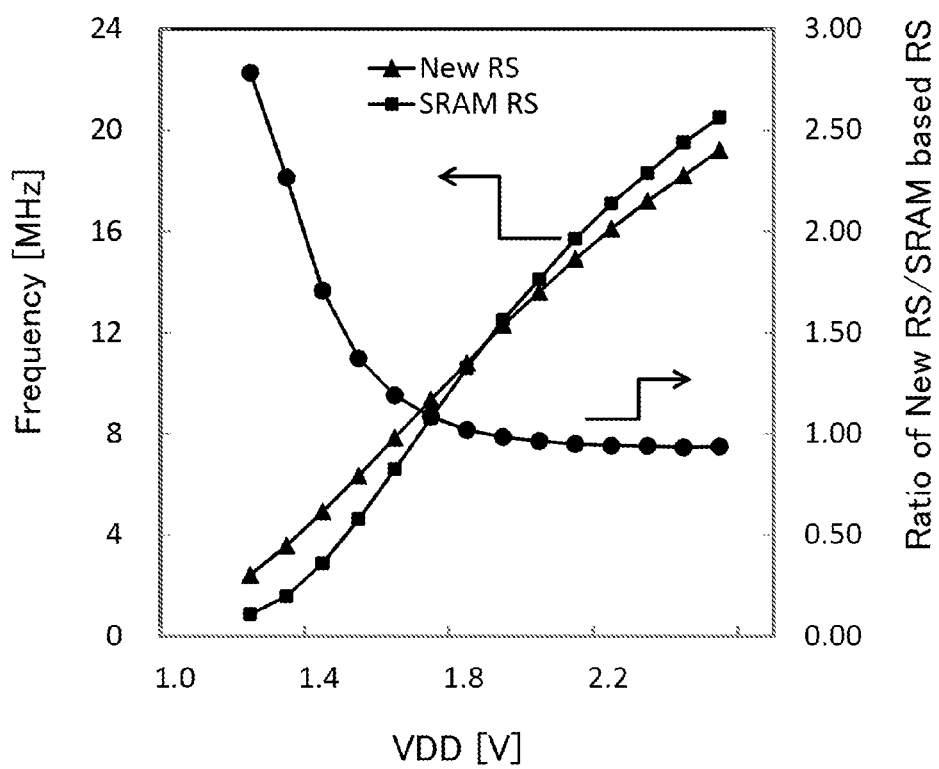
FIG. 23 shows simulated properties of a semiconductor device in Example.

FIG. 23 shows voltage dependence of the oscillation frequency of the ring oscillator with each type of the routing switches in the case where overdrive signals were applied to the context line CXa. As shown in the figure, the routing switch including the programmable switch 101a shown in FIG. 4B (New RS) has lower performance than the SRAM-based routing switch (SRAM RS) in a high voltage range; however, achieves better performance when driving voltage is lower than 1.8 V. For example, when the driving voltage is 1.5 V, speed of the routing switch is 37% faster than that of the SRAM-based routing switch.

Next, power consumption was examined. Scaling down the size of the configuration memory of the SRAM-based FPGA increases its static power consumption, and that of the scaled-down one was estimated to 38% of the total power consumption. By simulation using SPICE, the total energy for reconfiguring the routing switch including the programmable switch 101a shown in FIG. 4B was calculated to be 334 fJ, where 187 fJ was used to rewrite data and 147 fJ to set the potential of the source node SN to "L" (ground potential).

A structure of a semiconductor device equivalent to one simulated above is explained below. FIGS. 21A to 21H show layouts of wirings, semiconductor films and contact holes of the semiconductor device. Note that a cross (+) at the right end of each of the drawings serves as a marker. Therefore, if two or more drawings are overlapped so that all the crosses of them are completely overlapped with each other, the correct relationship between different layers could be understood.

The semiconductor device includes single crystalline silicon films (50 nm thick) on a silicon oxide layer over a single crystalline silicon wafer, first gate insulators (15 nm thick) formed by oxidizing single crystalline silicon films, first wirings (multilayered structure of 30-nm-thick tantalum nitride and 170-nm-thick W thereon) over the first gate insulators, a first interlayer insulator (multilayered structure of 50-nm-thick SiON, 280-nm-thick SiNO and 300-nm-thick SiOx), second wirings (150-nm-thick W), a second interlayer insulator (TEOS-SiOx with a thickness of 400-500 nm), third wirings (150-nm-thick W), a third interlayer insulator (multilayered structure of 50-nm-thick AlOx and 300-nm-thick SiOx), 15-nm-thick In—Ga—Zn oxide films, fourth wirings (100-nm-thick W), a second gate insulator (15-nm-thick SiON), fifth wirings (multilayered structure of 30-nm-thick tantalum nitride and 135-nm-thick W thereon), a fourth interlayer insulator (multilayered structure of 70-nm-thick AlOx and 300-nm-thick SiON), sixth wirings (multilayered structure of 50-nm-thick Ti, 200-nm-thick Al and 50-nm-thick Ti), a fifth interlayer insulator (1500-nm-thick polyimide), seventh wirings (multilayered structure of 50-nm-thick Ti, 300-nm-thick Al and 50-nm-thick Ti), and a sixth interlayer insulator (1500-nm-thick polyimide).

Some of the first wirings serves as gate electrodes of silicon-based transistors. Some of the second wirings serves as source or drain electrodes of the silicon-based transistors. Some of the third wirings serves as back gate electrodes of oxide-semiconductor-based transistors. Some of the fourth wirings serves as source or drain electrodes of the oxide-semiconductor-based transistors. Some of the fifth wirings serves as gate electrodes of the oxide-semiconductor-based transistors.

Contact holes for connection between different layers are formed in the first interlayer insulator, the second interlayer insulator, the third interlayer insulator, the second gate insulator, the fourth interlayer insulator and the fifth interlayer insulator.

Figure 21A:
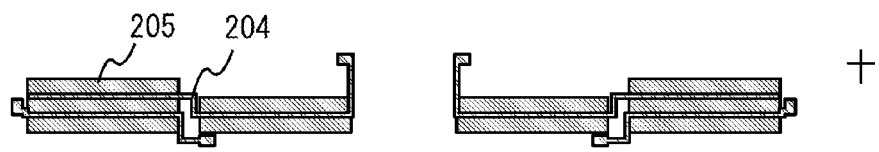
FIGS. 21A to 21H show layouts of wirings, semiconductor films and contact holes of a semiconductor device in Example.

FIG. 21A shows the layout of the single crystalline silicon films and the first wirings 204. The single crystalline silicon films includes n-type regions 205. Note that the portions of the single crystalline silicon films that overlap with the first wirings 204 are weakly p-type doped.

Figure 21B:
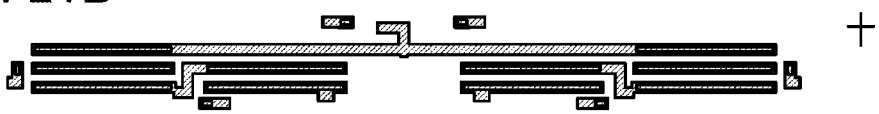

FIG. 21B shows the layout of the second wirings (hatched regions) and contact holes to the n-type regions 205 provided in the first interlayer insulator. The contact holes are shown as the rectangles in the hatched regions.

Figure 21C:

FIG. 21C shows the layout of the third wirings (hatched regions) and contact holes to the second wirings provided in the second interlayer insulator. The contact holes are shown as the rectangles in the hatched regions.

Figure 21D:

FIG. 21D shows the layout of the In—Ga—Zn oxide films.

Figure 21E:
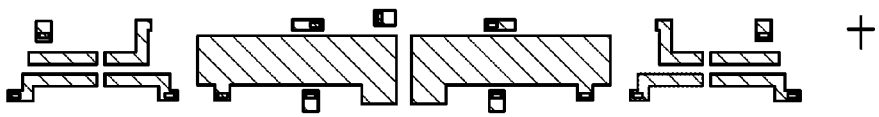

FIG. 21E shows the layout of the fourth wirings (hatched regions) and contact holes to the third wirings provided in the third interlayer insulator. The contact holes are shown as the rectangles in the hatched regions.

Figure 21F:
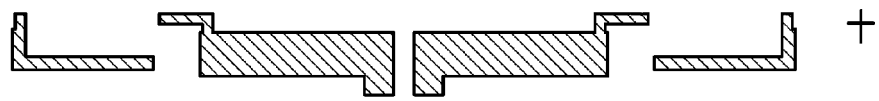

FIG. 21F shows the layout of the fifth wirings (hatched regions).

Figure 21G:
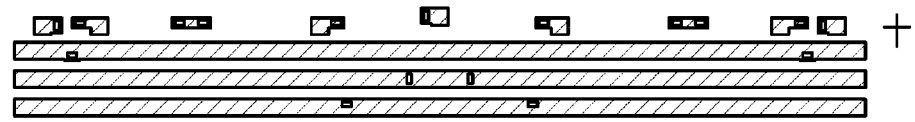

FIG. 21G shows the layout of the sixth wirings (hatched regions) and contact holes to the fourth wirings and the fifth wirings provided in the second gate insulator and the fourth interlayer insulator. The contact holes are shown as the rectangles in the hatched regions.

Figure 21H:
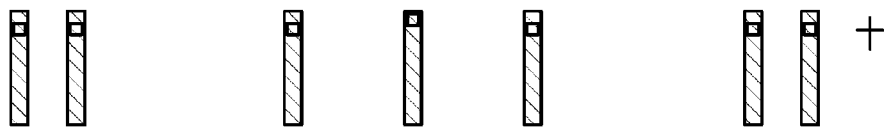

FIG. 21H shows the layout of the seventh wirings (hatched regions) and contact holes to the sixth wirings provided in the fifth interlayer insulator. The contact holes are shown as the rectangles in the hatched regions.

Note that the oxide semiconductor transistors are designed with a 1.0-μm rule while the single crystalline silicon transistors are with a 0.5-μm rule. The area of the semiconductor device with the above layouts is 38% smaller than that of the SRAM-based routing switch with a similar design rule.

This application is based on Japanese Patent Application serial no. 2014-091701 filed with Japan Patent Office on Apr. 25, 2014 and Japanese Patent Application serial no. 2014-180766 filed with Japan Patent Office on Sep. 5, 2014, and the entire contents of which are hereby incorporated by reference.

What is claimed is:
1. A semiconductor device comprising:
a first logic block;
a second logic block; and
a programmable switch comprising:
   a pass transistor;
   a first transistor;
   a second transistor; and
   a third transistor,
wherein the first logic block and the second logic block are connectable with each other through the programmable switch,
wherein the first transistor, the pass transistor and the second transistor are connected in series in this order,
wherein sources and drains of both the first transistor and the second transistor are located between the first logic block and the second logic block in a circuit diagram, and
wherein the semiconductor device is designed so that a potential can be supplied to one of a source and a drain of the pass transistor via the third transistor when both of the first transistor and the second transistor are in off-state.

2. The semiconductor device according to claim 1, further comprising a write transistor and a bit line,
wherein a source and a drain of the write transistor are provided between the bit line and a gate of the pass transistor in a circuit diagram.

3. The semiconductor device according to claim 2, wherein the write transistor comprises an oxide semiconductor film as an active layer.

4. The semiconductor device according to claim 2, further comprising a word line, wherein the write transistor and the third transistor are configured to be controlled by signals of the word line.

5. The semiconductor device according to claim 3, further comprising a word line, wherein the write transistor and the third transistor are configured to be controlled by signals of the word line.

6. The semiconductor device according to claim 2, wherein the gate of the pass transistor is substantially electrically isolated when the write transistor is in off-state.

7. The semiconductor device according to claim 3, wherein the gate of the pass transistor is substantially electrically isolated when the write transistor is in off-state.

8. The semiconductor device according to claim 4, wherein the gate of the pass transistor is substantially electrically isolated when the write transistor is in off-state.

9. The semiconductor device according to claim 5, wherein the gate of the pass transistor is substantially electrically isolated when the write transistor is in off-state.

10. A semiconductor device comprising:
a first logic block;
a second logic block; and
a programmable switch comprising:
 a first transistor;
 a second transistor;
 a third transistor; and
 a fourth transistor,
wherein an output terminal of the first logic block is electrically connected to a first terminal of the first transistor,
wherein a second terminal of the first transistor is electrically connected to a first terminal of the second transistor,
wherein a second terminal of the second transistor is electrically connected to a first terminal of the third transistor,
wherein a second terminal of the third transistor is electrically connected to an input terminal of the second logic block, and
wherein a first terminal of the fourth transistor is electrically connected to a gate of the second transistor.

11. The semiconductor device according to claim 10, wherein the fourth transistor comprises a channel formation region comprising an oxide semiconductor.

12. The semiconductor device according to claim 10, wherein a gate of the first transistor is electrically connected to a gate of the third transistor.

13. The semiconductor device according to claim 10, wherein the programmable switch comprises a capacitor, and
wherein a first electrode of the capacitor is electrically connected to the gate of the second transistor.

14. A semiconductor device comprising:
a first logic block;
a second logic block; and
a programmable switch comprising:
 a first transistor;
 a second transistor;
 a third transistor;
 a fourth transistor; and
 a fifth transistor,
wherein an output terminal of the first logic block is electrically connected to a first terminal of the first transistor,
wherein a second terminal of the first transistor is electrically connected to a first terminal of the second transistor,
wherein a second terminal of the second transistor is electrically connected to a first terminal of the third transistor,
wherein a second terminal of the third transistor is electrically connected to an input terminal of the second logic block,
wherein a first terminal of the fourth transistor is electrically connected to a gate of the second transistor, and
wherein a first terminal of the fifth transistor is electrically connected to the first terminal of the second transistor.

15. The semiconductor device according to claim 14, wherein the fourth transistor comprises a channel formation region comprising an oxide semiconductor.

16. The semiconductor device according to claim 14, wherein a gate of the first transistor is electrically connected to a gate of the third transistor.

17. The semiconductor device according to claim 14, wherein the programmable switch comprises a capacitor, and
wherein a first electrode of the capacitor is electrically connected to the gate of the second transistor.

18. The semiconductor device according to claim 14, wherein a gate of the fourth transistor is electrically connected to a gate of the fifth transistor.

19. The semiconductor device according to claim 14, wherein a gate of the first transistor is electrically connected to a gate of the third transistor and a second terminal of the fifth transistor.

20. The semiconductor device according to claim 14, wherein a gate of the first transistor is electrically connected to a gate of the third transistor and a second terminal of the fifth transistor, and
wherein a gate of the fourth transistor is electrically connected to a gate of the fifth transistor.

* * * * *